(12) United States Patent
Furuta et al.

(10) Patent No.: US 8,420,770 B2
(45) Date of Patent: Apr. 16, 2013

(54) INKJET INK

(75) Inventors: Tomotsugu Furuta, Chiba (JP); Satoshi Tanioka, Chiba (JP)

(73) Assignee: JNC Corporation, Tokyo (JP)

( * ) Notice: Subject to any disclaimer, the term of this patent is extended or adjusted under 35 U.S.C. 154(b) by 676 days.

(21) Appl. No.: 12/255,675

(22) Filed: Oct. 22, 2008

(65) Prior Publication Data

US 2009/0104414 A1 Apr. 23, 2009

(30) Foreign Application Priority Data

Oct. 23, 2007 (JP) ................................. 2007-274858
Jul. 30, 2008 (JP) ................................. 2008-195843

(51) Int. Cl.
*C08G 69/08* (2006.01)

(52) U.S. Cl.
USPC ............. 528/310; 525/431; 257/40; 257/202; 257/E29.151; 257/E29.295; 427/58; 106/31.13; 524/217; 562/565

(58) Field of Classification Search .................. 528/310; 525/341
See application file for complete search history.

(56) References Cited

U.S. PATENT DOCUMENTS

| | | | |
|---|---|---|---|
| 5,254,361 A | | 10/1993 | Kawamoto et al. |
| 2005/0287392 A1* | | 12/2005 | Toyoda .......................... 428/690 |
| 2006/0124925 A1* | | 6/2006 | Kondo et al. ................... 257/40 |

FOREIGN PATENT DOCUMENTS

| | | |
|---|---|---|
| EP | 0048221 | 3/1982 |
| EP | 0410702 | 1/1991 |
| EP | 0694594 | 1/1996 |
| JP | 03054277 | 3/1991 |
| JP | 03119071 | 5/1991 |
| JP | 08-041393 | 2/1996 |
| JP | 2000039714 | 2/2000 |
| JP | 2000309731 | 11/2000 |
| JP | 2003213165 | 7/2003 |
| JP | 2003238683 | 8/2003 |
| JP | 2004094118 | 3/2004 |
| JP | 2006131730 | 5/2006 |

OTHER PUBLICATIONS

European Search Report EP 08253401, Jan. 29, 2009.
"Office Action of Japan Counterpart Application", with partial English translation thereof, issued on Jan. 29, 2013, P1-P3, in which JPH08-041393 was cited.

* cited by examiner

*Primary Examiner* — Shane Fang
(74) *Attorney, Agent, or Firm* — Jianq Chyun IP Office

(57) ABSTRACT

An inkjet ink capable of forming a polyimide film having, for example, strong mechanical strength, is provided. The inkjet ink contains: a polyamic acid (A) having a weight-average molecular weight of 50,000-500,000; one or more of an amic acid compound (B1) and an amic acid compound (B2), in which the amic acid compound (B1) is prepared from a compound (a3) having two or more anhydride groups and a monoamine (a5), and the amic acid compound (B2) is prepared from a diamine (a4) and a compound (a6) having one anhydride group; and a solvent (C).

14 Claims, No Drawings

INKJET INK

CROSS-REFERENCE TO RELATED APPLICATION

This application claims the priority benefit of Japan application serial no. 2007-274858 and 2008-195843, filed on Oct. 23, 2007 and Jul. 30, 2008. The entirety of each of the above-mentioned patent applications is hereby incorporated by reference herein and made a part of this specification.

BACKGROUND OF THE INVENTION

1. Field of the Invention

The present invention generally relates to an inkjet ink, a polyamic acid composition for forming a layer of insulator film, for example, in manufacturing electronic components, a polyimide film formed by the composition, a film substrate formed with the polyimide film, and an electronic component having the film substrate.

2. Description of Related Art

Polyimide is a material widely used in the field of electronic communication due to excellent thermal resistance and electric insulation (see, for example, Patent Document 1, Patent Document 2, and Patent Document 3). When polyimide is used to form a film with desired patterns, the patterns are generally formed by etching or using photosensitive polyimide in prior art. In recent years, methods for forming the film with desired patterns by utilizing inkjet are under development.

Although various inkjet inks (see, for example, Patent Document 4, and Patent Document 5) are set forth, when preparing a polyimide system inkjet ink, the durability of inkjet head or the precision of jetting is decreased because the solvent contained in the ink composition is limited to an amide solvent, such as N-methyl-2-pyrrolidone, etc. Especially, when a flexible substrate is used, the problems on flexibility (a property for measuring whether the flexible substrate or the circuit thereon is curved or broken off when the flexible substrate is erected with two ends being grasped and alternatively moved upward and downward, also referred to as sliding characteristics) are frequently occurred; thus, a polyimide film having excellent flexibility is preferred.

[Patent Document 1] Japanese Laid-Open Publication No. 2000-039714

[Patent Document 2] Japanese Laid-Open Publication No. 2003-238683

[Patent Document 3] Japanese Laid-Open Publication No. 2004-094118

[Patent Document 4] Japanese Laid-Open Publication No. 2003-213165

[Patent Document 5] Japanese Laid-Open Publication No. 2006-131730

SUMMARY OF THE INVENTION

Accordingly, the present invention is directed to an inkjet ink having good inkjet printability and capable of forming a polyimide film with uniform thickness, strong mechanical strength, no cracks, and excellent flexibility.

The inventors found an inkjet ink having the following composition according to the situation above.

As embodied and broadly described herein, the present invention provides an inkjet ink as follows.

[1] An inkjet ink, containing:
a polyamic acid (A) having a weight-average molecular weight of 50,000-500,000 and a structural unit of Formula (1) below prepared from at least a compound (a1) having two or more anhydride groups and a diamine (a2);
at least one compound selected from the group consisting of an amic acid compound (B1) and an amic acid compound (B2), in which the amic acid compound (B1) is prepared from a compound (a3) having two or more anhydride groups and a monoamine (a5), and the amic acid compound (B2) is prepared from a diamine (a4) and a compound (a6) having one anhydride group; and
a solvent (C).

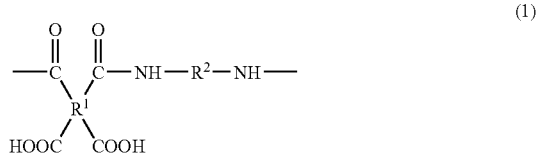

In Formula (1), $R^1$ and $R^2$ are each independently organic groups having 2-100 carbon atoms.

[2] The inkjet ink according to Item [1], in which the inkjet ink contains 0.5 wt %-20 wt % of the polyamic acid (A), 5 wt %-50 wt % of the amic acid compound (B1) and the amic acid compound (B2) in total, and 30 wt %-94.5 wt % of the solvent (C).

[3] The inkjet ink according to Item [1] or [2], in which the compounds (a1) and (a3) having two or more anhydride groups are each independently selected from the group consisting of tetracarboxylic dianhydride of Formula (2) below, and copolymers formed by a monomer having anhydride group and other polymerizable monomers.

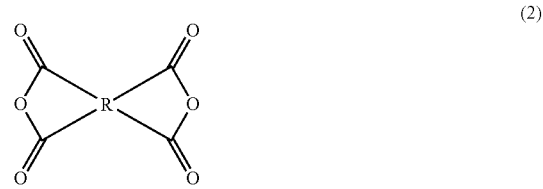

In Formula (2), each R is independently an organic group having 2-100 carbon atoms.

[4] The inkjet ink according to any one of Items [1]-[3], in which the diamine (a2) and (a4) are each independently diamines of general Formula (3) below.

$$H_2N-R-NH_2 \quad (3)$$

In Formula (3), each R is independently an organic group having 2-100 carbon atoms.

[5] The inkjet ink according to any one of Items [1]-[4], in which the monoamine (a5) is an amino silicon compound of general Formula (4) below.

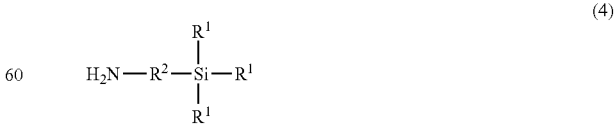

In Formula (4), each $R^1$ is independently hydrogen, halogen, or an organic group having 1-20 carbon atoms, and each $R^2$ is independently an organic group having 1-20 carbon atoms.

[6] The inkjet ink according to any one of Items [1]-[5], in which the compound (a6) having one anhydride group is a silicon containing carboxylic anhydride of general Formula (5) below.

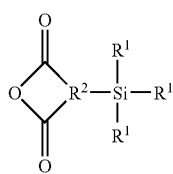

(5)

In Formula (5), each $R^1$ is independently hydrogen, halogen, or an organic group having 1-20 carbon atoms, and $R^2$ is an organic group having 1-20 carbon atoms. [7] The inkjet ink according to Item [3], in which the tetracarboxylic dianhydride of Formula (2) is one or more selected from the group consisting of pyromellitic dianhydride, 3,3',4,4'-benzophenonetetracarboxylic dianhydride, 2,2',3,3'-benzophenonetetracarboxylic dianhydride, 2,3,3',4'-benzophenonetetracarboxylic dianhydride, 3,3',4,4'-diphenylsulfonetetracarboxylic dianhydride, 2,2',3,3'-diphenylsulfonetetracarboxylic dianhydride, 2,3,3',4'-diphenylsulfonetetracarboxylic dianhydride, 3,3',4,4'-diphenylethertetracarboxylic dianhydride, 2,2',3,3'-diphenylethertetracarboxylic dianhydride, 2,3,3',4'-diphenylethertetracarboxylic dianhydride, 2,2-[bis(3,4-dicarboxylphenyl)]hexafluoropropane dianhydride, ethylene glycol bis(anhydrotrimellitate), cyclobutanetetracarboxylic dianhydride, methylcyclobutanetetracarboxylic dianhydride, cyclopentanetetracarboxylic dianhydride, 1,2,4,5-cyclohexanetetracarboxylic dianhydride, ethanetetracarboxylic dianhydride, and butanetetracarboxylic dianhydride.

[8] The inkjet ink according to Item [4], in which the diamine of Formula (3) is one or more selected from the group consisting of 3,3'-diaminodiphenyl sulfone, 4,4'-diaminodiphenyl ether, 4,4'-diaminodiphenylmethane, 3,3'-diaminodiphenylmethane, 3,3'-dimethyl-4,4'-diaminodiphenylmethane, 2,2-bis[4-(4-aminophenoxy)phenyl]propane, 2,2-bis[4-(4-aminophenoxy)phenyl]hexafluoropropane, m-phenylenediamine, p-phenylenediamine, m-xylylenediamine, p-xylylenediamine, 2,2'-diaminodiphenylpropane, benzidine, 1,1-bis[4-(4-aminophenoxy)phenyl]cyclohexane, 1,1-bis[4-(4-aminophenoxy)phenyl]-4-methylcyclohexane, bis[4-(4-aminobenzyl)phenyl]methane, 1,1-bis[4-(4-aminobenzyl)phenyl]cyclohexane, 1,1-bis[4-(4-aminobenzyl)phenyl]-4-methylcyclohexane, 1,1-bis[4-(4-aminobenzyl)phenyl]cyclohexane, 1,1-bis[4-(4-aminobenzyl)phenyl]-4-methylcyclohexane, 1,1-bis[4-(4-aminobenzyl)phenyl]methane, 1,3-bis(4-aminophenoxy)benzene, and a compound of Formula (XV) below.

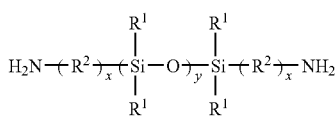

(XV)

In Formula (XV), each $R^1$ is independently alkyl group having 1-3 carbon atoms or phenyl, each $R^2$ is independently methylene, phenylene, or phenylene substituted with alkyl, each x is independently an integer of 1-6, and each y is independently an integer of 1-70.

[9] The inkjet ink according to Item [5], in which the amino silicon compound of Formula (4) is one or more selected from the group consisting of p-aminophenyltrimethoxysilane, p-aminophenyltriethoxysilane, m-aminophenyltrimethoxysilane, m-aminophenyltriethoxysilane, 3-aminopropyltrimethoxysilane, and 3-aminopropyltriethoxysilane.

[10] The inkjet ink according to Item [6], in which the silicon containing carboxylic anhydride of Formula (5) above is one or more selected from the group consisting of p-(trimethoxysilyl)phenylsuccinic anhydride, p-(triethoxysilyl)phenylsuccinic anhydride, m-(trimethoxysilyl)phenylsuccinic anhydride, m-(triethoxysilyl)phenylsuccinic anhydride, trimethoxysilylpropylsuccinic anhydride, and triethoxysilylpropylsuccinic anhydride.

[11] An inkjet ink, containing:
a polyamic acid (A) having a weight-average molecular weight of 50,000-500,000, prepared from a compound (a1) having two or more anhydride groups and a diamine (a2), in which the compound (a1) having two or more anhydride groups is at least one selected from the group consisting of 3,3',4,4'-diphenylether tetracarboxylic dianhydride and 2,2-[bis(3,4-dicarboxylphenyl)]hexafluoropropane dianhydride, and the diamine (a2) is at least one selected from the group consisting of 2,2-bis[4-(4-aminophenoxy)phenyl]propane and 1,3-bis(4-aminophenoxy)benzene;
an amic acid compound (B2), prepared from a diamine (a4) and a compound (a6) having one anhydride group, in which the diamine (a4) is 2,2-bis[4-(4-aminophenoxy)phenyl]propane, and the compound (a6) having one anhydride group is triethoxysilylpropylsuccinic anhydride; and
a solvent (C) being at least one selected from the group consisting of diethylene glycol methyl ethyl ether, N-methyl-2-pyrrolidone, and γ-butyrolatone.

[12] A polyimide film or a patterned polyimide film, prepared from the inkjet ink according to any one of Items [1]-[1,1].

[13] A polyimide film or a patterned polyimide film, prepared by forming a polyamic acid film by applying the inkjet ink according to any one of Items [1]-[11] through an ink jet method, and forming a polyimide film by processing the polyamic acid film.

[14] A film substrate, prepared by forming the polyimide film according to Item [12] or [13] on a substrate.

[15] An electronic component, having the film substrate according to Item [14].

EFFECTS OF THE INVENTION

According to an aspect of the present invention, the inkjet ink having, for example, excellent inkjet printability is capable of forming a polyimide film with uniform thickness. Furthermore, by using the inkjet ink according to an aspect of the present invention, a polyimide film having strong mechanical strength, no cracks, and good flexibility can be prepared.

For example, due to excellent thermal resistance and electric insulation of the polyimide film formed by the inkjet ink of the present invention, the reliability and the yield of electronic components can be improved.

BRIEF DESCRIPTION OF THE DRAWINGS

No drawings

DESCRIPTION OF THE EMBODIMENTS

Reference will now be made in detail to the present embodiments of the invention, examples of which are illustrated in the accompanying drawings. Wherever possible, the same reference numbers are used in the drawings and the description to refer to the same or like parts.

1 Inkjet Ink of the Present Invention

The inkjet ink of the present invention contains a polyamic acid (A), an amic acid compound (B1 and/or B2) and a solvent (C). The inkjet ink of the present invention can be colorless or colored.

The viscosity of the inkjet ink is not specially limited. When jetting at normal temperature (25° C.), the jetting precision of ink jet coating method can be improved if the viscosity of the inkjet ink is 1 mPa·s-50 mPa·s. Moreover, the viscosity of the inkjet ink at 25° C. is more preferably 5 mPa·s-30 mPa·s, and most preferably 8 mPa·s-20 mPa·s (25° C.). When the ink coating head is heated for jetting, the viscosity of the inkjet ink at heating temperature (preferably 40° C.-120° C.) is preferably 1 mPa·s-50 mPa·s, more preferably 5 mPa·s-30 mPa·s, and particularly preferably 8 mPa·s-20 mPa·s.

Herein, the viscosity of the inkjet ink is determined at 25° C. by using an E type viscosimeter (VISCONIC ELD manufactured by TOKYO KEIKI).

1.1 Polyamic Acid (A)

Polyamic acid (A) has a structural unit of Formula (1). The structural unit of Formula (1) is described as follows.

1.1.1 Structural Unit of Formula (1)

In Formula (1), each $R^1$ in each structural unit is independently a quadrivalent organic group having 2-100 carbon atoms, and each $R^2$ in each structural unit is independently a divalent organic group having 2-100 carbon atoms. The quadrivalent and divalent "organic group having 2-100 carbon atoms" is preferably an organic group having 3-70 carbon atoms, and more preferably an organic group having 4-50 carbon atoms.

As for the "organic group", the specific examples include: substituted or unsubstituted hydrocarbon group having 2-20 carbon atoms, substituted or unsubstituted alkoxy group having 2-20 carbon atoms, substituted or unsubstituted aryloxy group having 6-20 carbon atoms, substituted or unsubstituted amino group, substituted or unsubstituted silyl group, substituted or unsubstituted alkylthio group ($-SY^1$, in which $Y^1$ represents substituted or unsubstituted alkyl group having 2-20 carbon atoms), substituted or unsubstituted arylthio group ($-SY^2$, in which $Y^2$ represents an substituted or unsubstituted aryl group having 6-18 carbon atoms), substituted or unsubstituted alkylsulfonyl group ($-SO_2Y^3$, in which $Y^3$ represents an substituted or unsubstituted alkyl having 2-20 carbon atoms), and substituted or unsubstituted arylsulfonyl group ($-SO_2Y^4$, in which $Y^4$ represents substituted or unsubstituted aryl group having 6-18 carbon atoms).

The "hydrocarbon group having 2-20 carbon atoms" can be a saturated or unsaturated acyclic hydrocarbon group, or a saturated or unsaturated cyclic hydrocarbon group. When being an acyclic hydrocarbon group, the hydrocarbon group having 2-20 carbon atoms can be linear or branched. The "hydrocarbon group having 2-20 carbon atoms" includes: alkyl group having 2-20 carbon atoms, alkenyl group having 2-20 carbon atoms, alkynyl group having 2-20 carbon atoms, alkadienyl group having 4-20 carbon atoms, aryl group having 6-18 carbon atoms, alkylaryl group having 7-20 carbon atoms, arylalkyl group having 7-20 carbon atoms, cycloalkyl group having 4-20 carbon atoms, cycloalkenyl group having 4-20 carbon atoms, and the like.

The "alkyl group having 2-20 carbon atoms" is preferably an alkyl group having 2-20 carbon atoms, and more preferably an alkyl group having 2-6 carbon atoms. Examples of the alkyl group include: methyl, ethyl, propyl, isopropyl, butyl, isobutyl, s-butyl, t-butyl, pentyl, hexyl, dodecyl, and the like.

The "alkenyl group having 2-20 carbon atoms" is preferably an alkenyl group having 2-10 carbon atoms, and more preferably an alkenyl group having 2-6 carbon atoms. Examples of alkenyl group include: vinyl, allyl, 1-propenyl, isopropenyl, 2-methyl-1-propenyl, 2-methylallyl, 2-butenyl, and the like.

The "alkynyl group having 2-20 carbon atoms" is preferably an alkynyl group having 2-10 carbon atoms, and more preferably an alkynyl group having 2-6 carbon atoms. Examples of the alkynyl group include: ethynyl, propynyl, butynyl, and the like.

The "alkadienyl group having 4-20 carbon atoms" is preferably an alkadienyl group having 4-10 carbon atoms, and more preferably an alkadienyl group having 4-6 carbon atoms. Examples of the alkadienyl group include 1,3-butadienyl, and the like.

The "aryl group having 6-18 carbon atoms" is preferably an aryl group having 6-10 carbon atoms. Examples of the aryl group include: phenyl, 1-naphthyl, 2-naphthyl, indenyl, biphenylyl, anthryl, phenanthryl, and the like.

The "alkylaryl group having 7-20 carbon atoms" is preferably an alkylaryl group having 7-12 carbon atoms. Examples of the alkylaryl group include: o-tolyl, m-tolyl, p-tolyl, 2,3-xylyl, 2,4-xylyl, 2,5-xylyl, o-cumenyl, m-cumenyl, p-cumenyl, 2,4,6-mesityl, and the like.

The "arylalkyl group having 7-20 carbon atoms" is preferably an arylalkyl group having 7-12 carbon atoms. Examples of the arylalkyl group include: benzyl, phenethyl, diphenylmethyl, triphenylmethyl, 1-naphthylmethyl, 2-naphthylmethyl, 2,2-diphenylethyl, 3-phenylpropyl, 4-phenylbutyl, 5-phenylpentyl, and the like.

The "cycloalkyl group having 4-20 carbon atoms" is preferably a cycloalkyl group having 4-10 carbon atoms. Examples of the cycloalkyl group include: cyclopropyl, cyclobutyl, cyclopentyl, cyclohexyl, and the like.

The "cycloalkenyl group having 4-20 carbon atoms" is preferably a cycloalkenyl group having 4-10 carbon atoms. Examples of the cycloalkenyl group include: cyclopropenyl, cyclobutenyl, cyclopentenyl, cyclohexenyl, and the like.

The "alkoxy group having 2-20 carbon atoms" is preferably an alkoxy group having 2-10 carbon atoms, and more preferably an alkoxy group having 2-6 carbon atoms. Examples of the alkoxy group include: ethoxy, propoxy, butoxy, pentoxy, and the like.

The "aryloxy group having 6-20 carbon atoms" is preferably an aryloxy group having 6-10 carbon atoms. Examples of the aryloxy group include: phenoxy, naphthyloxy, biphenyloxy, and the like.

In the "alkylthio group ($-SY^1$, in which $Y^1$ represents substituted or unsubstituted alkyl group having 2-20 carbon atoms)" and the "alkylsulfonyl group ($-SO_2Y^3$, in which $Y^3$ represents an substituted or unsubstituted alkyl group having 1-20 carbon atoms)", $Y^1$ and $Y^3$ are preferably alkyl groups having 2-10 carbon atoms, and more preferably alkyl groups having 2-6 carbon atoms. Examples of the alkyl group include: methyl, ethyl, propyl, isopropyl, butyl, isobutyl, s-butyl, t-butyl, pentyl, hexyl, dodecyl, and the like.

In the "arylthio group ($-SY^2$, in which $Y^2$ represents a substituted or unsubstituted aryl group having 6-18 carbon atoms)" and the "arylsulfonyl group ($-SO_2Y^4$, in which $Y^4$ represents a substituted or unsubstituted aryl group having 6-18 carbon atoms)", $Y^2$ and $Y^4$ are preferably aryl groups having 6-10 carbon atoms. Examples of the aryl group include: phenyl, 1-naphthyl, 2-naphthyl, indenyl, biphenylyl, anthryl, phenanthryl, and the like.

In the "hydrocarbon group having 1-20 carbon atoms", the "alkoxy group having 2-20 carbon atoms", the "aryloxy group having 6-20 carbon atoms", "amino", "silyl", "alkylthio", "arylthio", "alkylsulfonyl" and "arylsulfonyl", a substituent can be incorporated. Examples of the substituent include ester group, carboxyl, amido group, alkynyl, trimethylsilyl, amino group, phosphonyl, thio group, carbonyl, nitro group, sulpho group, imino group, halo-containing group, alkoxy, and the like.

Herein, the number of the substituents incorporated to the substitutable positions can be one or more, up to the most possible substitution number, and preferably one to four. When two or more substituents are incorporated, each can be identical or different.

Examples of the "substituted or unsubstituted amino group" include: amino, dimethylamino, methylamino, methylphenylamino, phenylamino, and the like.

Examples of the "substituted or unsubstituted silyl group" include: dimethylsilyl, diethylsilyl, trimethylsilyl, triethylsilyl, trimethoxysilyl, triethoxysilyl, diphenylmethylsilyl, triphenylsilyl, triphenoxysilyl, dimethylmethoxysilyl, dimethylphenoxysilyl, methylmethoxyphenylsilyl, and the like.

Hereinbefore, the organic group is substantially described by monovalent specific examples. The specific examples of divalent organic group can be described by the group formed by increasing the valence of the monovalent organic group by 1. Similarly, the quadrivalent organic group can be described by the group formed by increasing the valence of the monovalent organic group by 3. Furthermore, the organic group in chemical formula of Formula (1) above can also be applied to describe the "organic group" in chemical Formulas of other numbers.

Polyamic acid (A) can at least be prepared from a compound (a1) having two or more anhydride groups and a diamine (a2) through the production process described below, and is not limited to the polyamic acid produced through that process.

1.1.2 Reaction Conditions for Synthesizing Polyamic Acid (A)

Polyamic acid (A) can be synthesized by, for example, a compound (a1) having two or more anhydride groups and a diamine (a2). Preferably, when the amount of the compound (a1) having two or more anhydride groups is 1 mole, the amount of the diamine (a2) is 0.9-1.1 mole. More preferably, when the amount of the compound (a1) having two or more anhydride groups is 1 mole, the amount of the diamine (a2) is 0.95-1.05 mole. Most preferably, when the amount of the compound (a1) having two or more anhydride groups is 1 mole, the amount of the diamine (a2) is 1 mole (equal mole).

1.1.3 Reaction Solvent

As long as the polyamic acid (A) can be synthesized, the solvent for synthesizing polyamic acid (A) by a compound (a1) having two or more anhydride groups and a diamine (a2) is not specially limited. The solvent includes, for example, diethylene glycol dimethyl ether, diethylene glycol diethyl ether, diethylene glycol methyl ethyl ether, diethylene glycol monoethyl ether acetate, ethylene glycol monoethyl ether acetate, propylene glycol monomethyl ether acetate, methyl 3-methoxypropionate, ethyl 3-ethoxypropionate, cyclohexanone, γ-butyrolatone, N-methyl-2-pyrrolidone, N,N-dimethylformamide, N,N-dimethylacetamide, and the like. Due to the high solubility of polyamic acid (A), among the solvents above, γ-butyrolatone, N-methyl-2-pyrrolidone, N,N-dimethylformamide, and N,N-dimethylacetamide are preferred. The reaction solvents can be used alone or as a mixed solvent made by mixing two or more solvents. Furthermore, in addition to the reaction solvents above, other solvents can also be mixed and used.

When the total amount of the compound (a1) having two or more anhydride groups and the diamine (a2) is 100 weight parts, the amount of the reaction solvent is preferably 100 weight parts or above for smooth performing the reaction. Preferably, the reaction is carried out at 0° C.-100° C. for 0.2-20 hours.

1.1.4 Addition Order to Reaction System

Furthermore, the addition order of the reaction raw materials to the reaction system is not specially limited. Namely, any one of the following methods can be used: simultaneously adding the compound (a1) having two or more anhydride groups and the diamine (a2) into the reaction solvent; dissolving the diamine (a2) into the reaction solvent, followed by the addition of the compound (a1) having two or more anhydride groups; and dissolving the compound (a1) having two or more anhydride groups into the reaction solvent, followed by the addition of the diamine (a2).

1.1.5 Concentration of Polyamic Acid (A)

Concentration of the polyamic acid (A) in the inkjet ink is preferably 0.5 wt %-20 wt %, more preferably 1 wt %-10 wt %, and most preferably 2 wt %-4 wt %. In this concentration range, the viscosity of the inkjet ink can be adjusted to be in the range suitable for inkjet printing. Furthermore, the coating formed by the prepared inkjet ink has strong mechanical strength, excellent thermal resistance, chemical resistance, and good flatness.

1.1.6 Weight-Average Molecular Weight of Polyamic Acid (A)

Polyamic acid (A) with a weight-average molecular weight of 50,000-500,000 can form a polyimide film having uniform thickness, strong mechanical strength, no cracks, and good flexibility, thus being suitable for preparing the inkjet ink. Preferably, polyamic acid (A) with a weight-average molecular weight of 50,000 or above is used for preparing the inkjet ink, as the resulting polyimide film has strong mechanical strength, no cracks, good flexibility, and uniform thickness. On the other hand, polyamic acid (A) with a weight-average molecular weight of 500,000 or below is stable during ink jet printing. In order to further improve the ink jet printability of the inkjet ink and the mechanical strength of the resulting polyimide film, the weight-average molecular weight of the polyamic acid (A) is preferably 50,000-500,000, more preferably 65,000-200,000, and most preferably 80,000-180,000.

The weight-average molecular weight of the polyamic acid (A) can be determined by gel permeation chromatography (GPC). Specifically, the resulting polyamic acid (A) is diluted with N,N-dimethylformamide (DMF) to a content of about 1 wt %, then determined through gel permeation chromatography (GPC) by using columns G4000HXL, G3000HXL, G2500HXL, and G2000HXL manufactured by Tosoh Corp. with DMF as developing solvent, and then polystyrene conversion is performed, so as to obtain the weight-average molecular weight.

1.1.7 Compound (a1) Having Two or More Anhydride Groups

The compound (a1) having two or more anhydride groups for synthesizing the polyamic acid (A) include copolymers of free radical polymerizable monomer having anhydride group with other free radical polymerizable monomer or tetracarboxylic dianhydride of Formula (2), and the like, for example, styrene-maleic anhydride copolymer, and methyl methacrylate-maleic anhydride copolymer. Tetracarboxylic dianhydride include, for example, pyromellitic dianhydride, 3,3',4,4'-benzophenonetetracarboxylic dianhydride, 2,2',3,3'- benzophenonetetracarboxylic dianhydride, 2,3,3',4'-benzophenonetetracarboxylic dianhydride, 3,3',4,4'-diphenylsulfonetetracarboxylic dianhydride, 2,2',3,3'-diphenylsulfonetetracarboxylic dianhydride, 2,3,3',4'-diphenylsulfonetetracarboxylic dianhydride, 3,3',4,4'-diphenylethertetracarboxylic dianhydride, 2,2',3,3'-diphenylethertetracarboxylic dianhydride, 2,3,3',4'-diphenylethertetracarboxylic dianhydride, 2,2-[bis(3,4-dicarboxylphenyl)]hexafluoropropane dianhydride, ethylene glycol bis(anhydrotrimellitate), cyclobutanetetracarboxylic dianhydride, methylcyclobutanetetracarboxylic dianhydride, cyclopentanetetracarboxylic dianhydride, 1,2,4,5-cyclohexanetetracarboxylic dianhydride, ethane tetracarboxylicdianhydride, butanetetracarboxylic dianhydride, and those of Formulas (a1-1)-(a1-73) below.

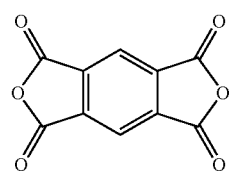

a1-1

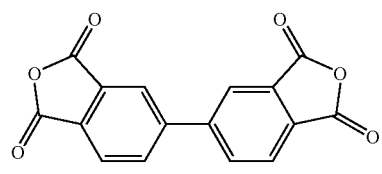

a1-2

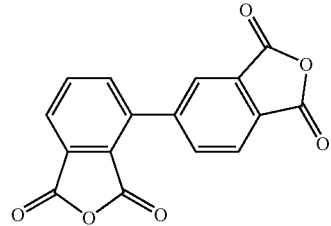

a1-3

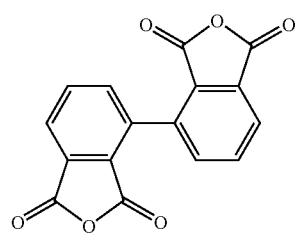

a1-4

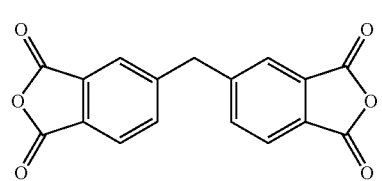

a1-5

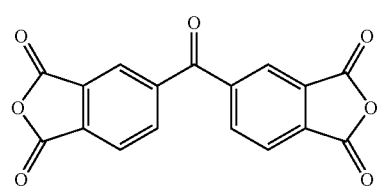

a1-6

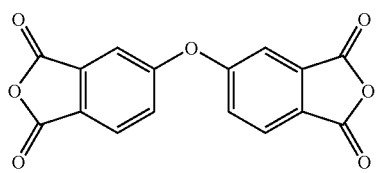

a1-7

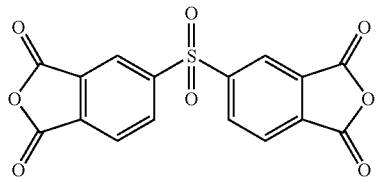

a1-8

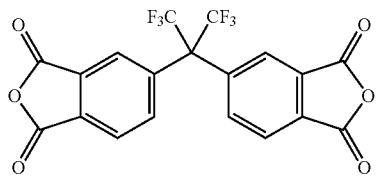

a1-9

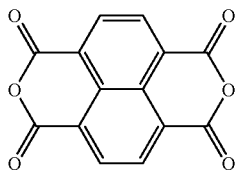

a1-10

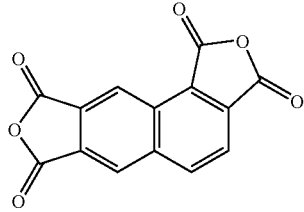

a1-11

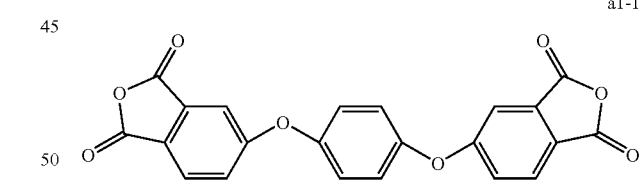

a1-12

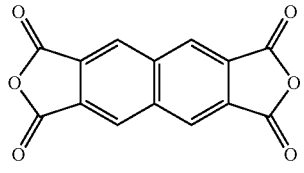

a1-13

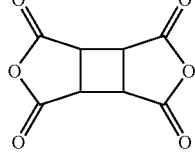

a1-14

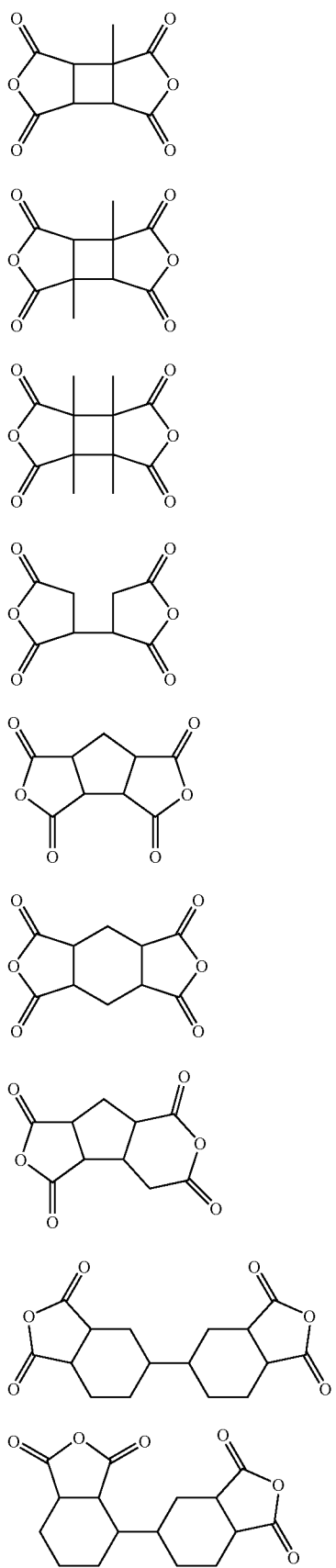
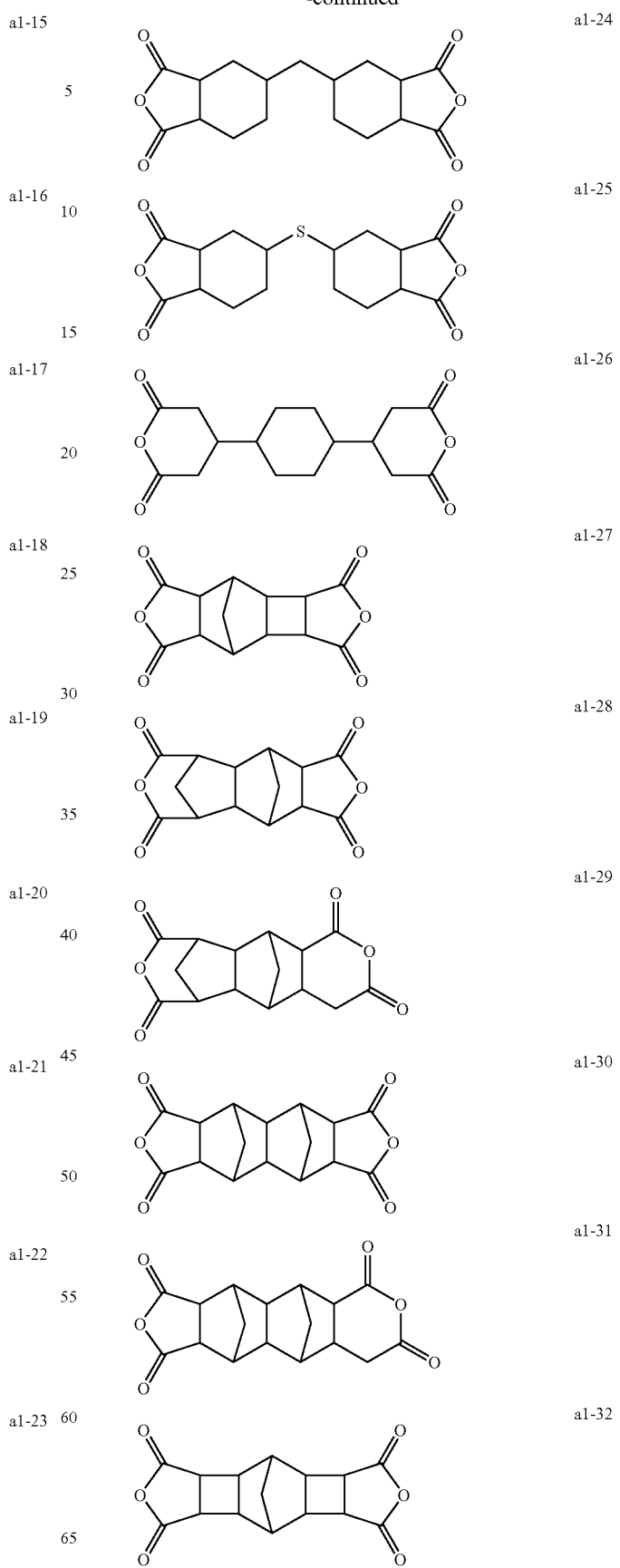

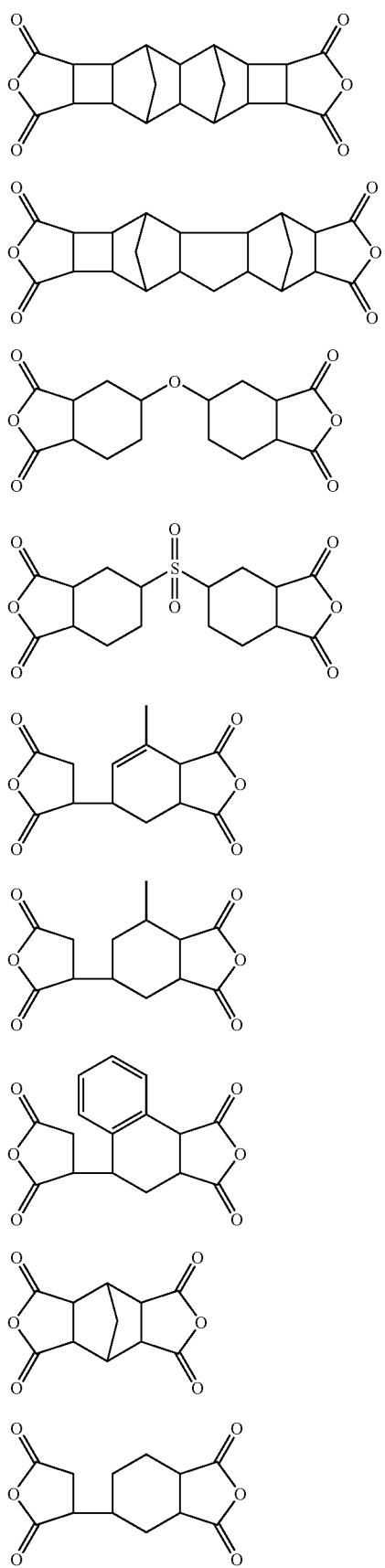
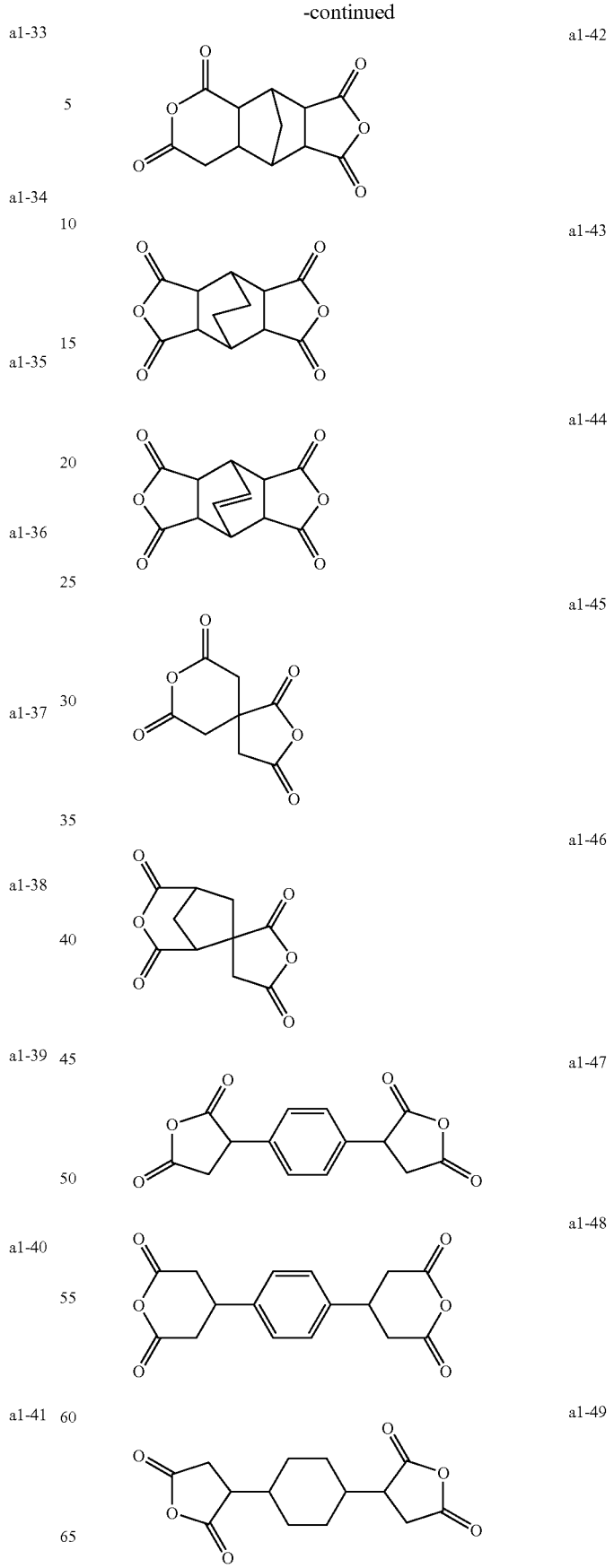

15
-continued
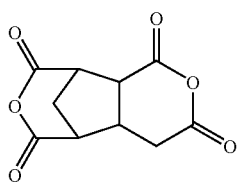
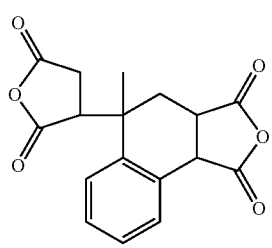
a1-51
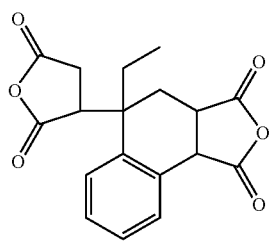
a1-52
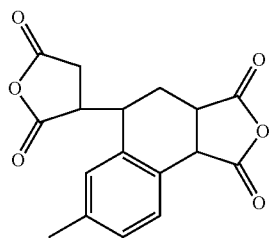
a1-53
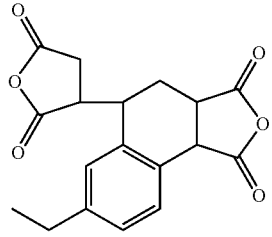
a1-54
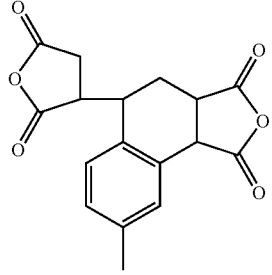
a1-55
16
-continued
a1-50
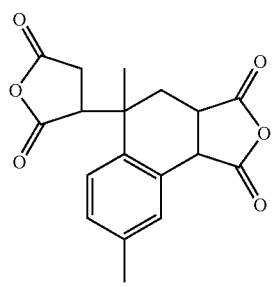
a1-56
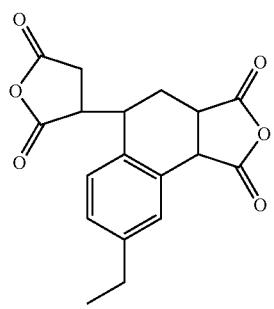
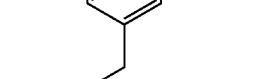
a1-57
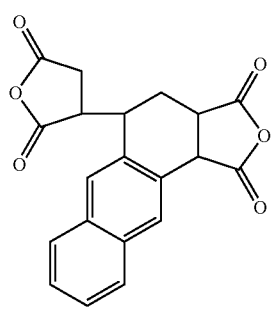
a1-58
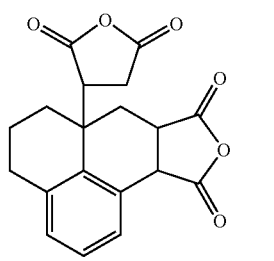
a1-59
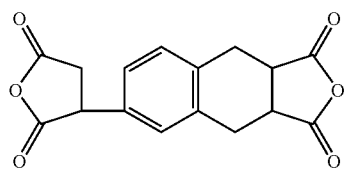
a1-60
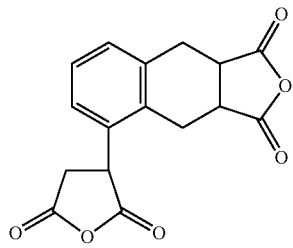
a1-61

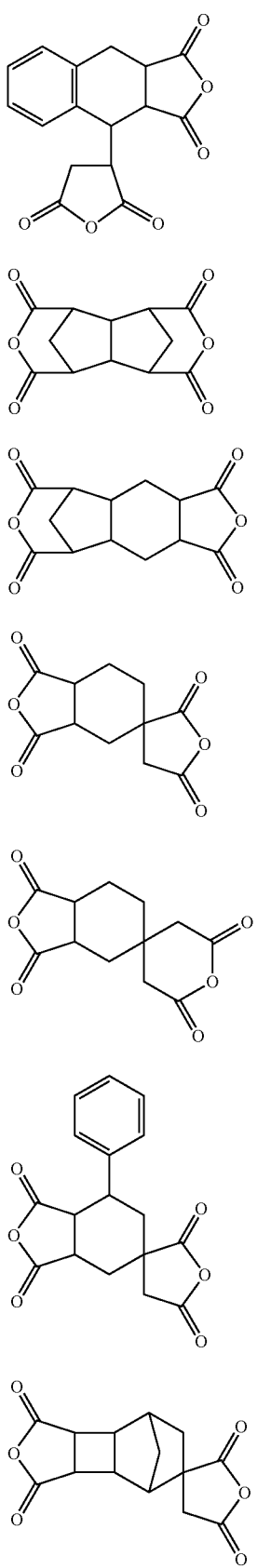
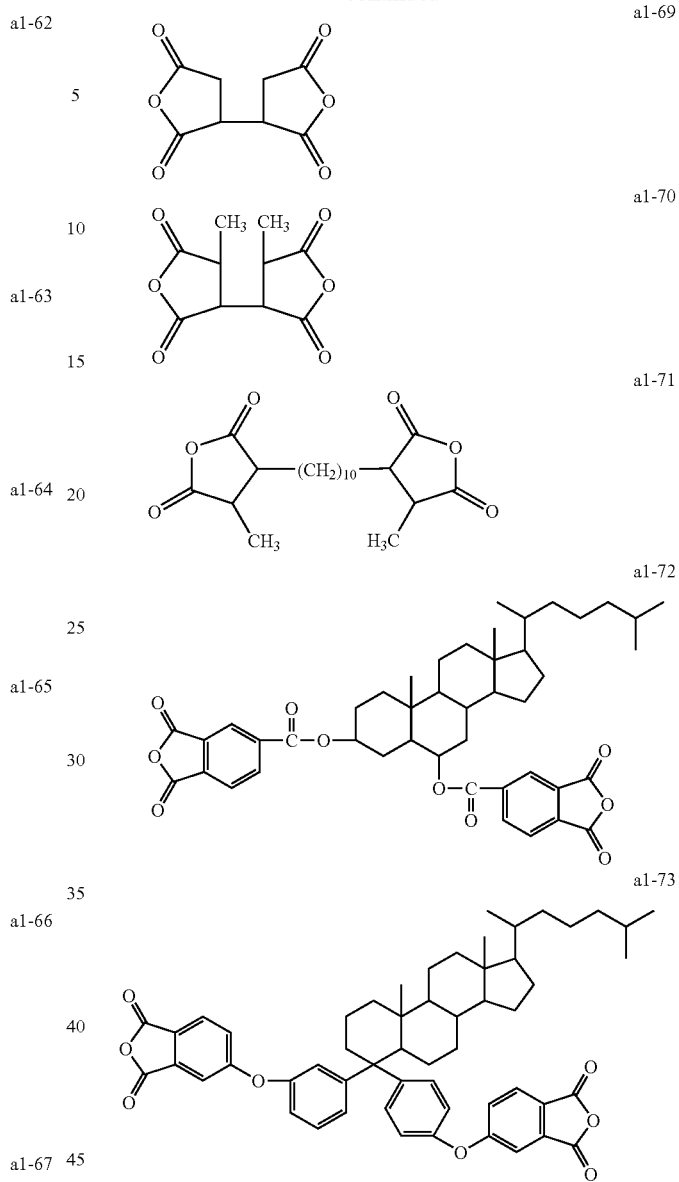

In the specific examples of tetracarboxylic dianhydride, the compounds of Formula (a1-1), Formula (a1-2), Formula (a1-5), Formula (a1-6), Formula (a1-7), Formula (a1-8), Formula (a1-9), Formula (a1-14), Formula (a1-15), Formula (a1-16), Formula (a1-17), Formula (a1-18), and Formula (a1-20) is highly soluble in a solvent, can be used to prepare the inkjet ink, thus being preferred. Moreover, high insulation is required due to the usage of the inkjet ink; in this case, compounds of Formula (a1-14), Formula (a1-15), Formula (a1-16), Formula (a1-17), Formula (a1-18) and Formula (a1-20) are particularly preferred.

Additionally, the compound having anhydride group can be used alone or in combination of two or more compounds. Furthermore, if the aromatic tetracarboxylic dianhydride of Formula (a1-1), Formula (a1-2), Formula (a1-5), Formula (a1-6), Formula (a1-7), Formula (a1-8), and Formula (a1-9) are used in combination with the alicyclic tetracarboxylic dianhydride of Formula (a1-14), Formula (a1-15), Formula (a1-16), Formula (a1-17), and Formula (a1-20), high solubility in solvent and high insulation of the polyimide film can be realized simultaneously, and thus being preferred. Most preferably, pyromellitic dianhydride of Formula (a1-1) is used in combination with 1,2,3,4-cyclobutane tetracarboxylic dianhydride of Formula (a1-14), or 2,2',3,3'-biphenylyltetracarboxylic dianhydride of Formula (a1-2) is used in combination with 1,2,3,4-cyclobutane tetracarboxylic dianhydride of Formula (a1-14).

1.1.8 Diamine (a2)

In the present invention, diamine (a2) for synthesizing the polyamic acid (A) is not specially limited provided that it contains two amino groups, and includes, for example, 3,3'-diaminodiphenylsulfone, 4,4'-diaminodiphenyl ether, 4,4'-diaminodiphenylmethane, 3,3'-diaminodiphenylmethane, 3,3'-dimethyl-4,4'-diaminodiphenylmethane, 2,2-bis[4-(4-aminophenoxy)phenyl]propane, 2,2-bis[4-(4-aminophenoxy)phenyl]hexafluoropropane, 1,3-bis(4-aminophenoxy)benzene, m-phenylenediamine, p-phenylenediamine, m-xylylenediamine, p-xylylenediamine, 2,2'-diaminodiphenylpropane, benzidine, 1,1-bis[4-(4-aminophenoxy)phenyl]cyclohexane, 1,1-bis[4-(4-aminophenoxy)phenyl]-4-methylcyclohexane, bis[4-(4-aminobenzyl)phenyl]methane, 1,1-bis[4-(4-aminobenzyl)phenyl]cyclohexane, 1,1-bis[4-(4-aminobenzyl)phenyl]-4-methylcyclohexane, 1,1-bis[4-(4-aminobenzyl)phenyl]cyclohexane, 1,1-bis[4-(4-aminobenzyl)phenyl]-4-methylcyclohexane, and 1,1-bis[4-(4-aminobenzyl)phenyl]methane. Furthermore, the compounds of Formulas (II)-(VIII) below can also be exemplified.

  (II)

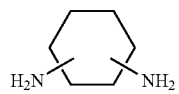  (III)

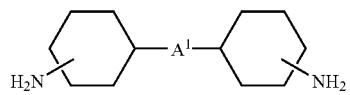  (IV)

  (V)

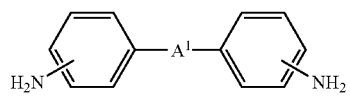  (VI)

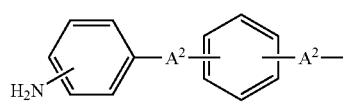  (VII)

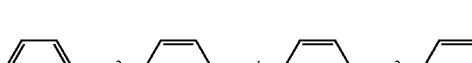  (VIII)

In Formula (II), $A^1$ is $-(CH_2)_m-$, and m is an integer of 1-6.

In Formula (IV) and Formulas (VI)-(VIII), $A^1$ is a single bond, $-O-$, $-S-$, $-S-S-$, $-SO_2-$, $-CO-$, $-CONH-$, $-NHCO-$, $-C(CH_3)_2-$, $-C(CF_3)_2-$, $-(CH_2)_m-$, $-O-(CH_2)_m-O-$, and $-S-(CH_2)_m-S-$, and m is an integer of 1-6; and $A^2$ is a single bond, $-O-$, $-S-$, $-CO-$, $-C(CH_3)_2-$, $-C(CF_3)_2-$, or alkylene having 1-3 carbon atoms.

In Formulas (III)-(VIII), hydrogen bonded onto cyclohexane ring or benzene ring can be substituted with $-F$ or $-CH_3$.

For diamine of Formula (II), diamines of Formulas (II-1)-(II-3) below can be exemplified.

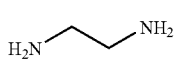  II-1

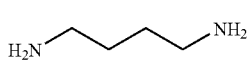  II-2

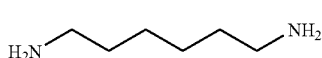  II-3

For diamine of Formula (III), diamines of Formulas (III-1) and (III-2) below can be exemplified.

  III-1

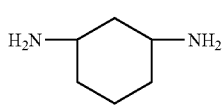  III-2

For diamine of Formula (IV), diamines of Formulas (IV-1) and (IV-3) below can be exemplified.

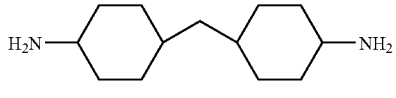  IV-1

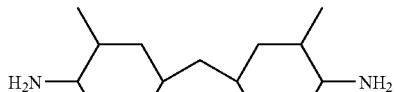  IV-2

  IV-3

For diamine of Formula (V), diamines of Formulas (V-1) and (V-5) below can be exemplified.

  V-1

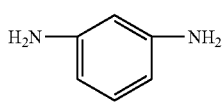  V-2

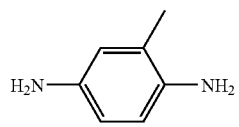
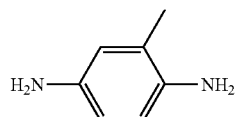
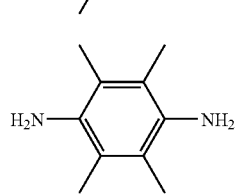
For diamine of Formula (VI), diamines of Formulas (VI-1) and (VI-30) below can be exemplified.
VI-1
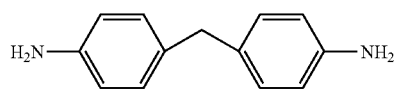
VI-2
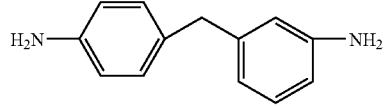
VI-3
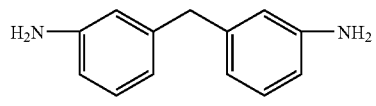
VI-4
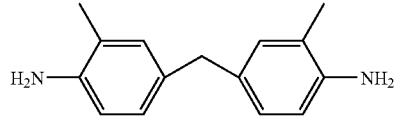
VI-5
VI-6
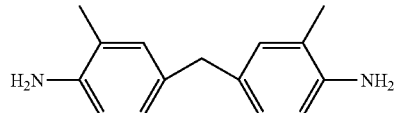
VI-7
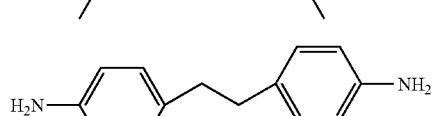
VI-8
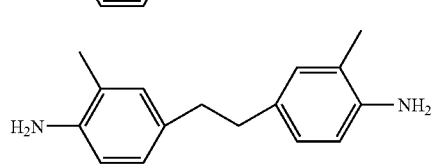
VI-9
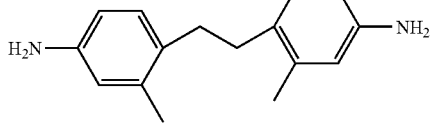
VI-10
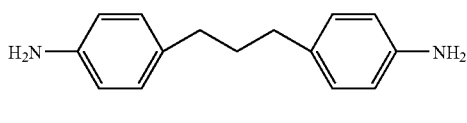
VI-11
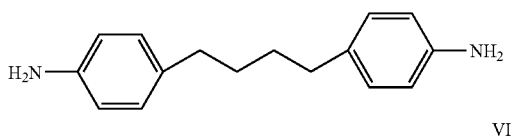
VI-12
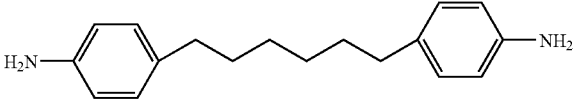
VI-13
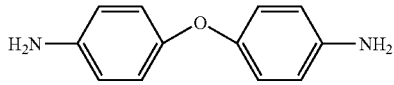
VI-14
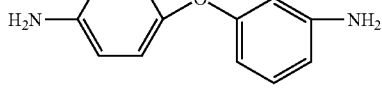
VI-15
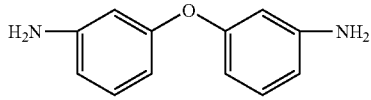
VI-16
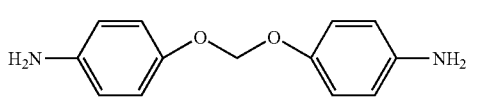
VI-17
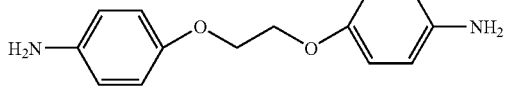
VI-18
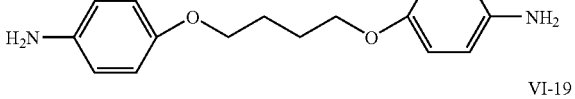
VI-19
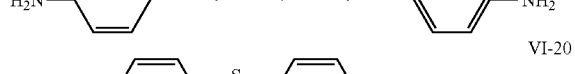
VI-20
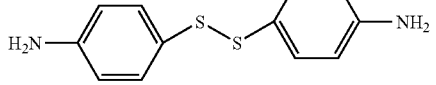
VI-21
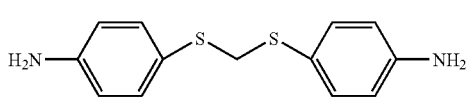
VI-22

VI-23
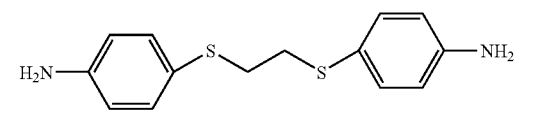
VI-24
VI-25
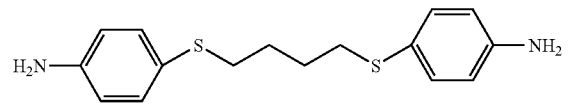
VI-26
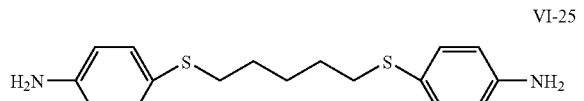
VI-27
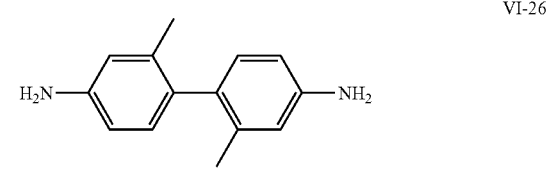
VI-28
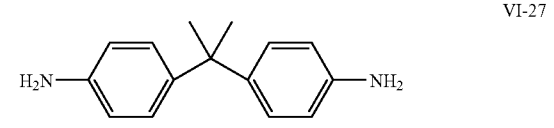
VI-29
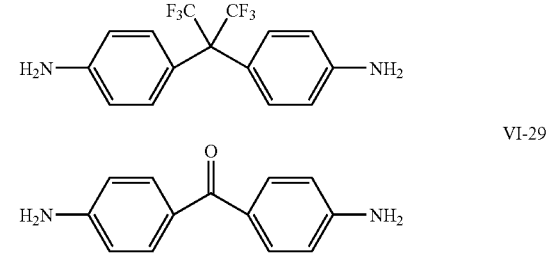
VI-30
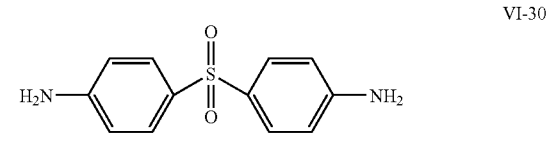
For diamine of Formula (VII), diamines of Formulas (VII-1) and (VII-6) below can be exemplified.
VII-1
VII-2
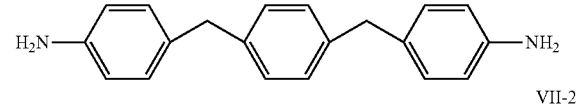
VII-3
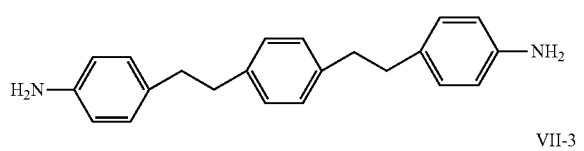
VII-4
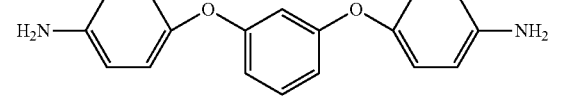
VII-5
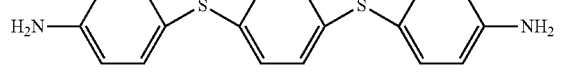
VII-6
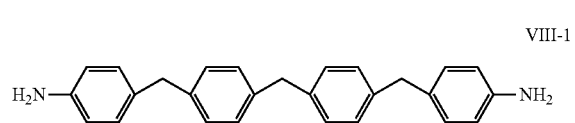
For diamine of Formula (VIII), diamines of Formulas (VIII-1) and (VIII-11) below can be exemplified.
VIII-1
VIII-2
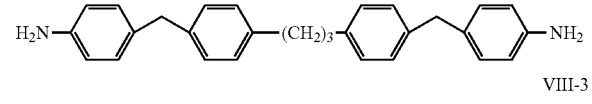
VIII-3
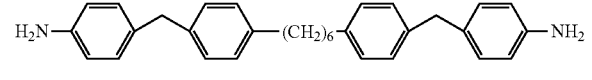
VIII-4
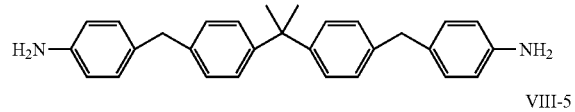
VIII-5
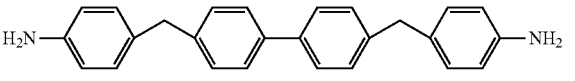
VIII-6
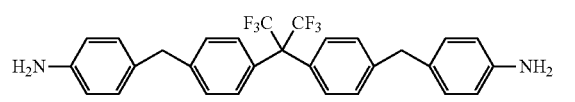
VIII-7
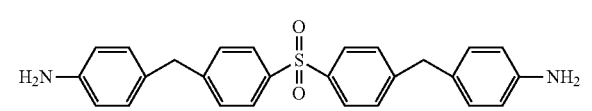
VIII-8
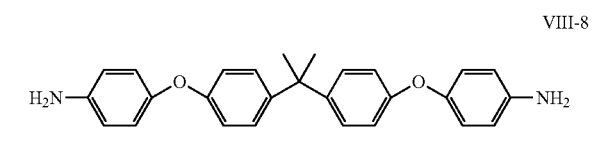
VIII-9
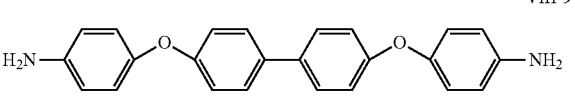

-continued

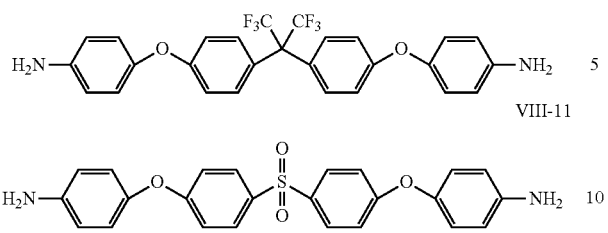
VIII-10

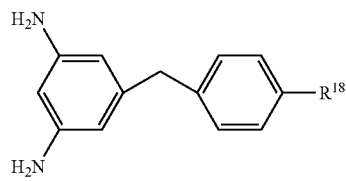
VIII-11

Among the specific examples, diamines (a2) of Formulas (II)-(VIII), aromatic diamines of Formulas (V-1)-(V-5), Formulas (VI-1)-(VI-15), Formula (VI-26), Formula (VI-27), Formulas (VII-1)-(VII-6), and Formulas (VIII-1)-(VIII-11) are preferably exemplified. Diamines of Formula (V-1), Formula (VI-1), Formula (VI-7), Formula (VI-10), and Formula (VI-13) are more preferably exemplified.

Examples of the diamine (a2) for synthesizing polyamic acid (A) further include diamine of Formula (IX) below.

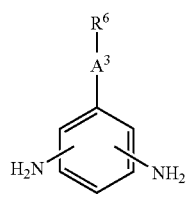
(IX)

In Formula (IX):

$A^3$ is a single bond, —O—, —COO—, —OCO—, —CO—, —CONH—, or —$(CH_2)_m$— (in which m is an integer of 1-6); and $R^6$ is a group having the steroid backbone; a group having one or more selected from the group consisting of cyclohexane ring and benzene ring; or an alkyl group having 2-30 carbon atoms, when the two amino groups bonded onto benzene ring are in para position with respected to each other, or an alkyl group having 1-10 carbon atoms or phenyl, when the two amino groups are in meta position with respected to each other, and in the alkyl, any —$CH_2$— can be substituted with —$CF_2$—, —CHF—, —O—, —CH═CH—, or —C≡C—, —$CH_3$ can be substituted with —$CH_2F$, —$CHF_2$, or —$CF_3$, and hydrogen bonded to the carbon of the benzene ring can be replaced by —F, —$CH_3$, —$OCH_3$, —$OCH_2F$, —$OCHF_2$, or —$OCF_3$.

In Formula (IX), two amino groups are bonded to the carbons of benzene ring, preferably in meta or para position with respect to each other. More preferably, when the bond position of "$R^6$-$A^3$-" is designated as 1, the two amino groups are respectively bonded at positions 3 and 5, or 2 and 5.

For diamine of Formula (IX), diamines of Formulas (IX-1)-(IX-11) below can be exemplified.

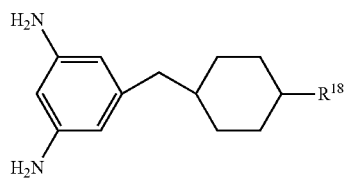
IX-1

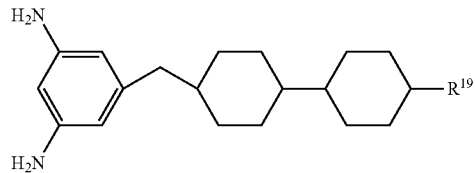
IX-2

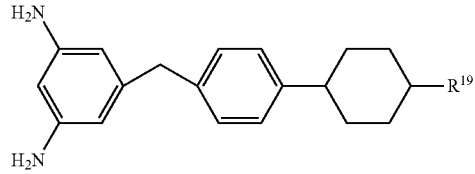
IX-3

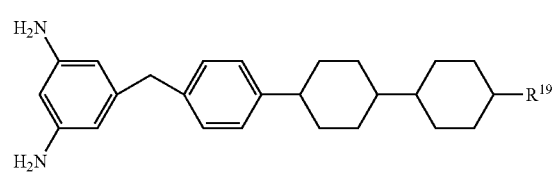
IX-4

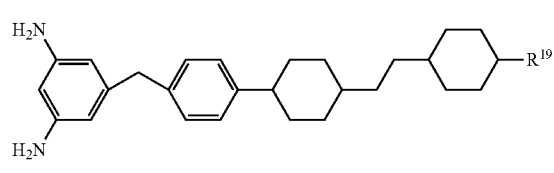
IX-5

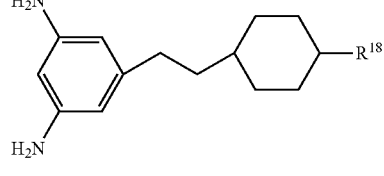
IX-6

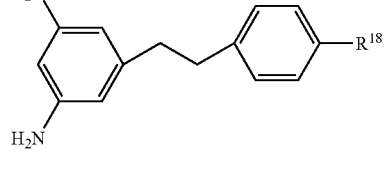
IX-7

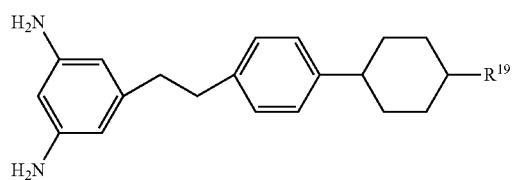
IX-8

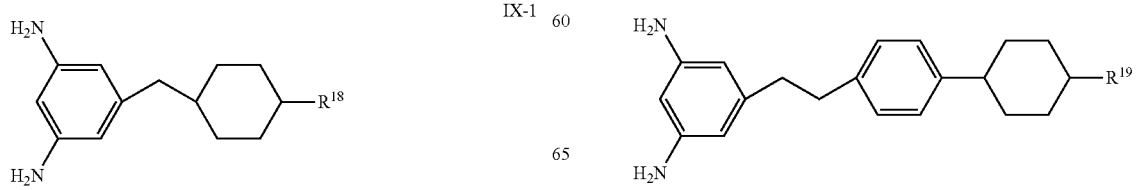
IX-9

-continued

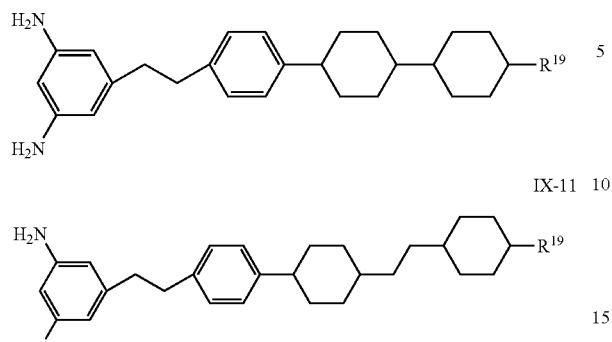

IX-10

IX-11

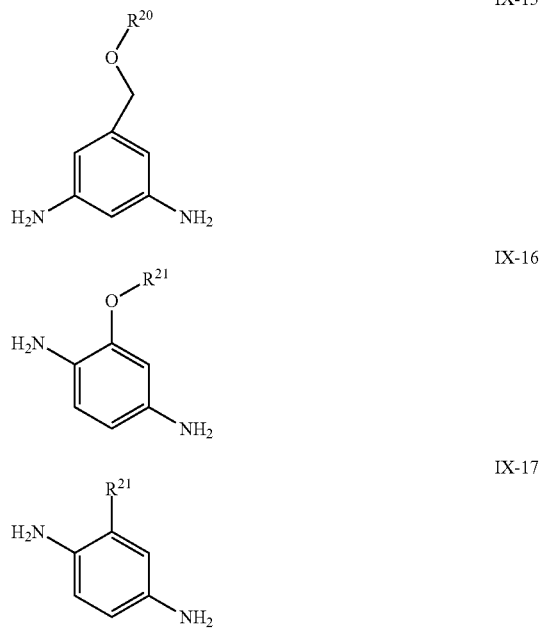

IX-15

IX-16

IX-17

In Formula (IX-1), Formula (IX-2), Formula (IX-7) and Formula (IX-8), $R^{18}$ is an organic group having 2-30 carbon atoms, and preferably an alkyl group having 3-12 carbon atoms, or an alkoxy group having 3-12 carbon atoms, and more preferably an alkyl group having 5-12 carbon atoms, or an alkoxy group having 5-12 carbon atoms. Furthermore, in Formulas (IX-3)-(IX-6) and Formulas (IX-9)-(IX-11), $R^{19}$ is —H or an organic group having 1-30 carbon atoms, and preferably an alkyl group having 1-10 carbon atoms, or an alkoxy group having 1-10 carbon atoms, and more preferably an alkyl group having 3-10 carbon atoms, or an alkoxy group having 3-10 carbon atoms.

Examples of the diamine of Formula (IX) further include diamines of Formulas (IX-12)-(IX-17) below.

In Formulas (IX-12)-(IX-15), $R^{20}$ is —H or an organic group having 1-30 carbon atoms, preferably an alkyl group having 4-16 carbon atoms, and more preferably an alkyl group having 6-16 carbon atoms. In Formula (IX-16) and Formula (IX-17), $R^{21}$ is —H or an organic group having 1-30 carbon atoms, preferably an alkyl group having 6-20 carbon atoms, and more preferably an alkyl group having 8-20 carbon atoms.

Examples of the diamine of Formula (IX) further include diamines of Formulas (IX-18)-(IX-38) below.

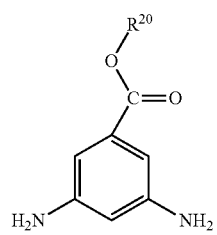

IX-12

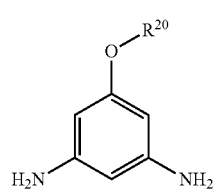

IX-13

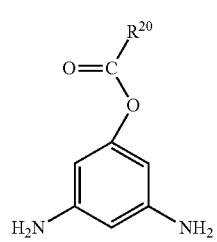

IX-14

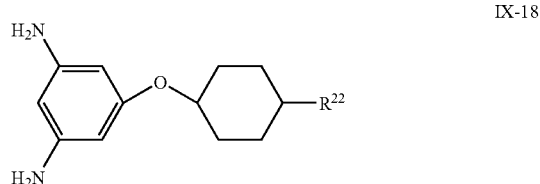

IX-18

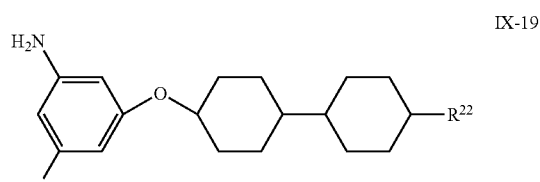

IX-19

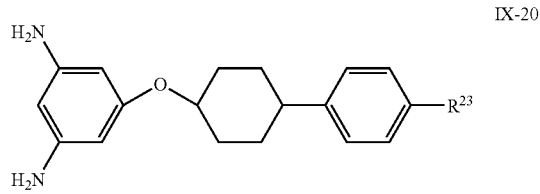

IX-20

-continued
IX-21
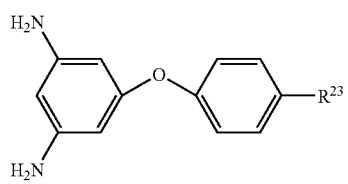
IX-22
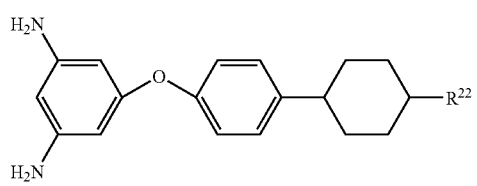
IX-23
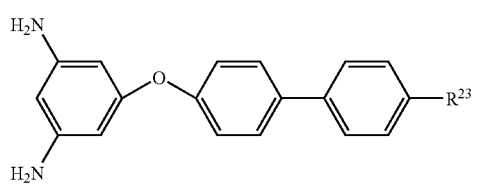
IX-24
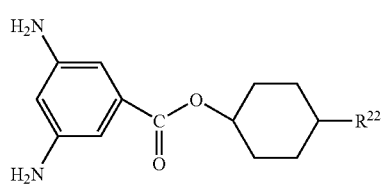
IX-25
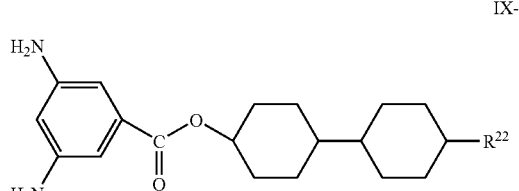
IX-26
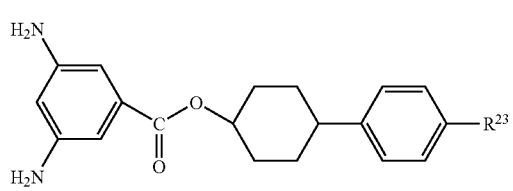
IX-27
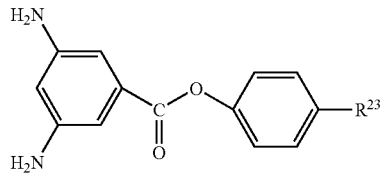
IX-28
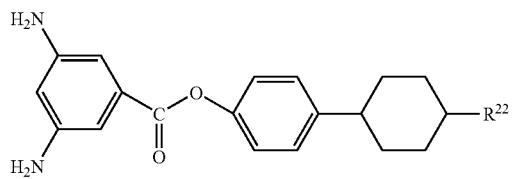
-continued
IX-29
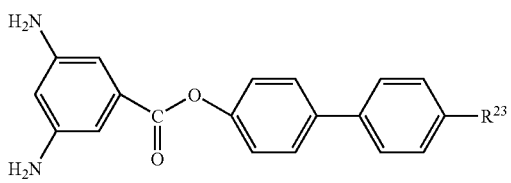
IX-30
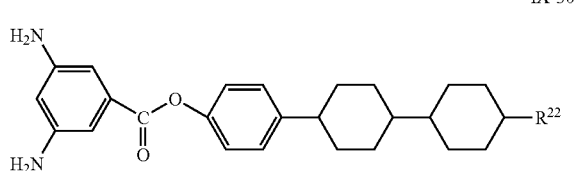
IX-31
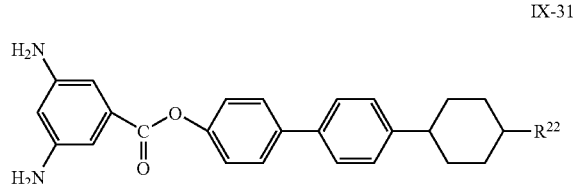
IX-32
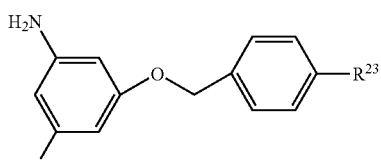
IX-33
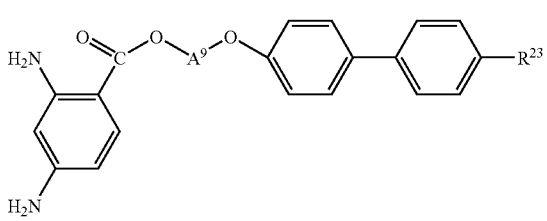
IX-34
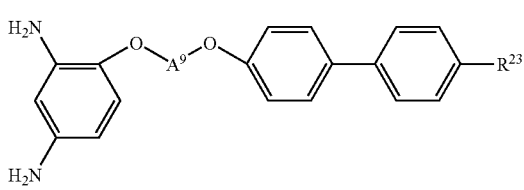
IX-35
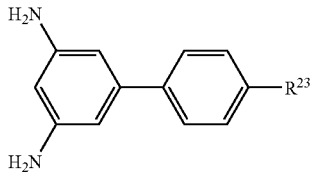
IX-36
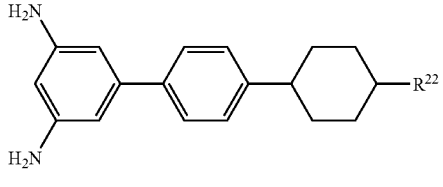

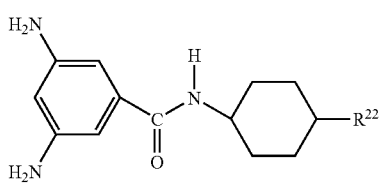

IX-37

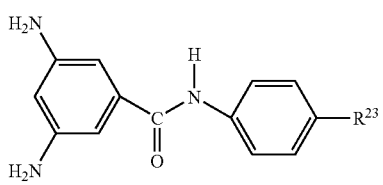

IX-38

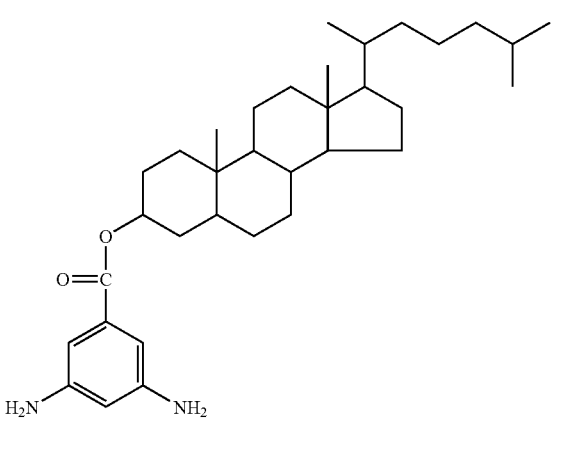

IX-40

In Formula (IX-18), Formula (IX-19), Formula (IX-22), Formula (IX-24), Formula (IX-25), Formula (IX-28), Formula (IX-30), Formula (IX-31), Formula (IX-36), and Formula (IX-37), $R^{22}$ is —H or an organic group having 1-30 carbon atoms, preferably an alkyl group having 1-12 carbon atoms and an alkoxy group having 1-12 carbon atoms, and more preferably an alkyl group having 3-12 carbon atoms or an alkoxy group having 3-12 carbon atoms. Furthermore, in Formula (IX-20), Formula (IX-21), Formula (IX-23), Formula (IX-26), Formula (IX-27), Formula (IX-29), Formulas (IX-32)-(IX-35), and Formula (IX-38), $R^{23}$ is —H, —F, an alkyl group having 1-12 carbon atoms, an alkoxy group having 1-12 carbon atoms, —CN, —OCH$_2$F, —OCHF$_2$, or —OCF$_3$, preferably an alkyl group having 3-12 carbon atoms or an alkoxy group having 3-12 carbon atoms. In Formula (IX-33) and Formula (IX-34), $A^9$ is an alkylene group having 1-12 carbon atoms.

Examples of the diamine of Formula (IX) further include diamines of Formulas (IX-39)-(IX-48) below.

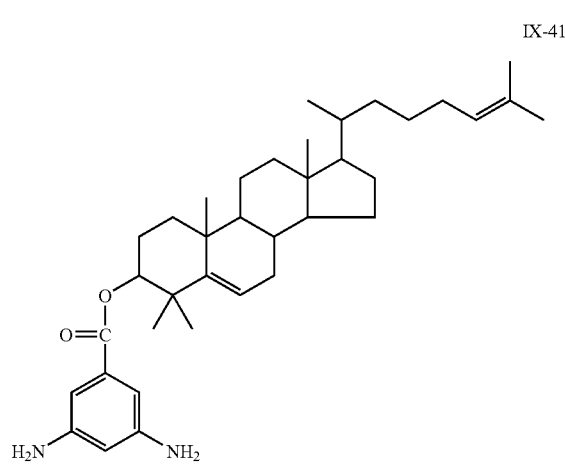

IX-41

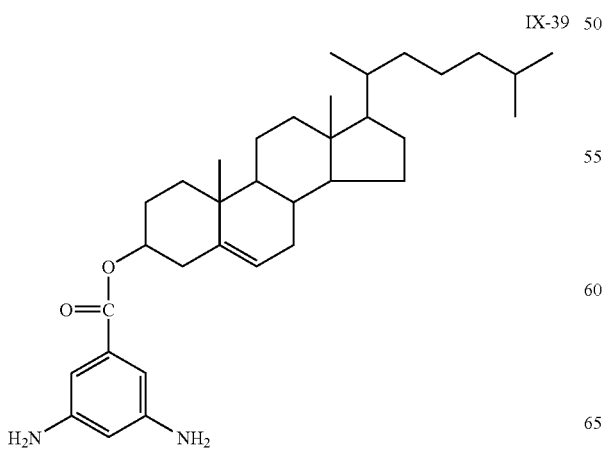

IX-39

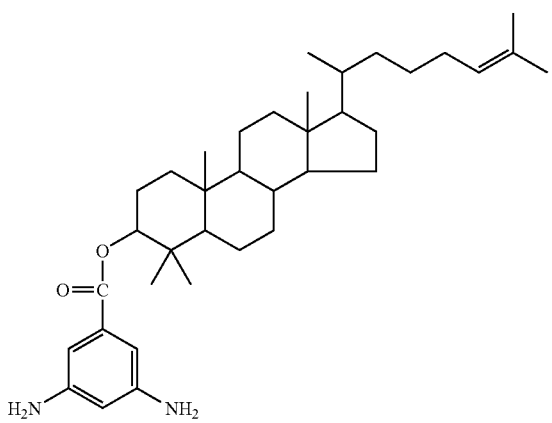

IX-42

IX-43

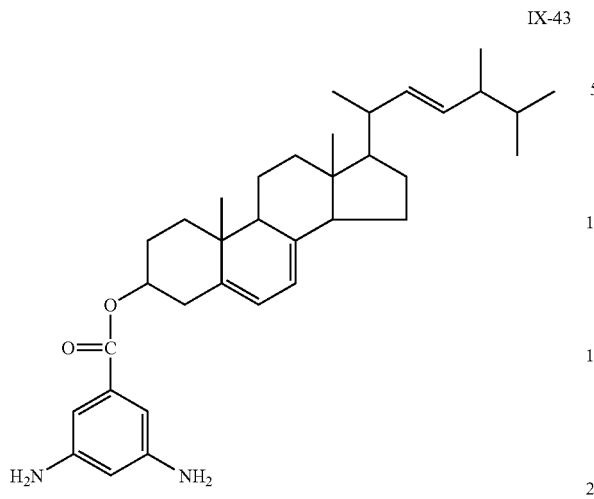

IX-44

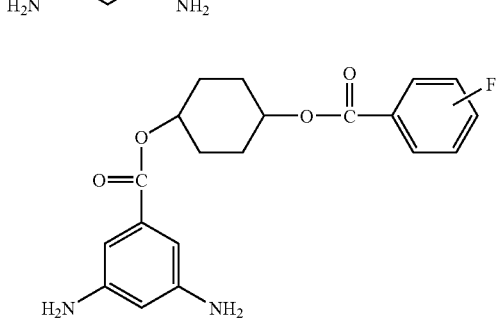

IX-45

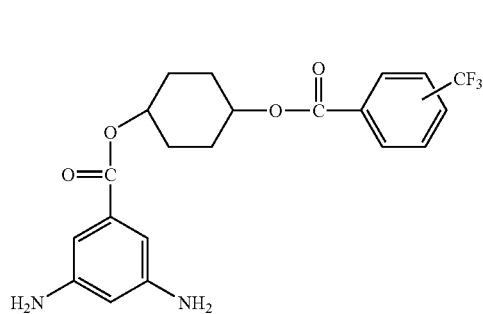

IX-46

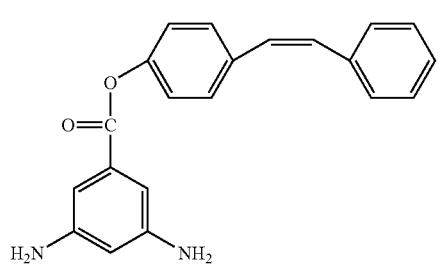

IX-47

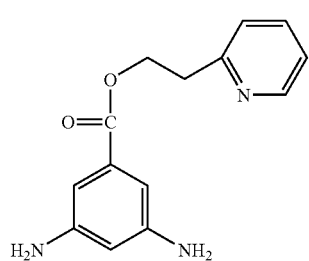

IX-48

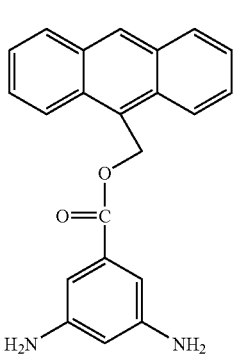

Among the diamine (a2) of Formula (IX), the diamine of Formulas (IX-1)-(IX-11) is preferred, and the diamines of Formula (IX-2), Formula (IX-4), Formula (IX-5), and Formula (IX-6) are more preferred.

Examples of the diamine (a2) for synthesizing polyamic acid (A) further include compounds of Formulas (XI)-(XII) below.

(XI)

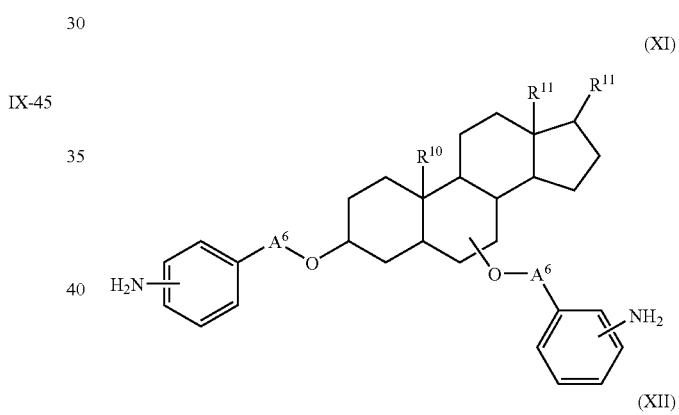

(XII)

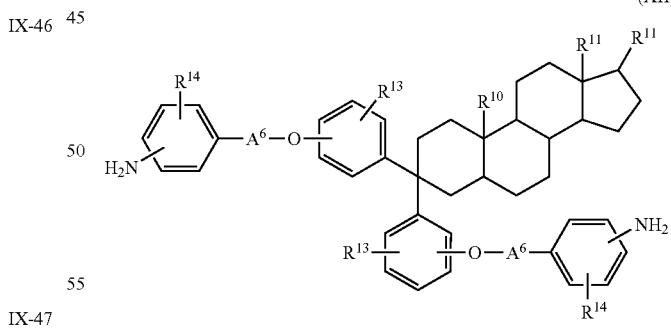

In Formula (XI) and (XII), $R^{10}$ is —H or —CH$_3$, each $R^{11}$ is independently —H or an alkyl group having 1-20 carbon atoms or an alkenyl group having 2-20 carbon atoms, each $A^6$ is independently a single bond, —C(=O)— or —CH$_2$—, and $R^{13}$ and $R^{14}$ are independently —H, an alkyl group having 1-20 carbon atoms, or phenyl.

In Formula (XI), one of the two "$NH_2$-Ph-$A^6$-O—" groups is preferably bonded at position 3 of the steroid nucleus, and the other is bonded at position 6. Moreover, the two amino groups are respectively bonded onto carbons of the benzene ring, preferably in meta or para position with respect to the bond position of $A^6$.

For diamine of Formula (XI), diamines of Formulas (XI-1)-(XI-4) below can be exemplified.

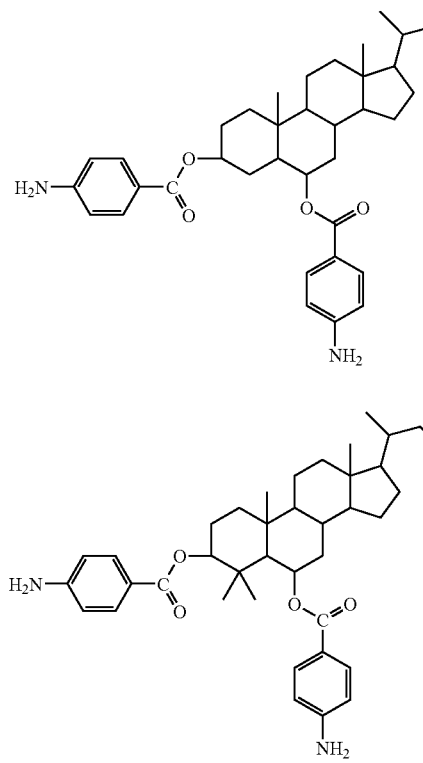

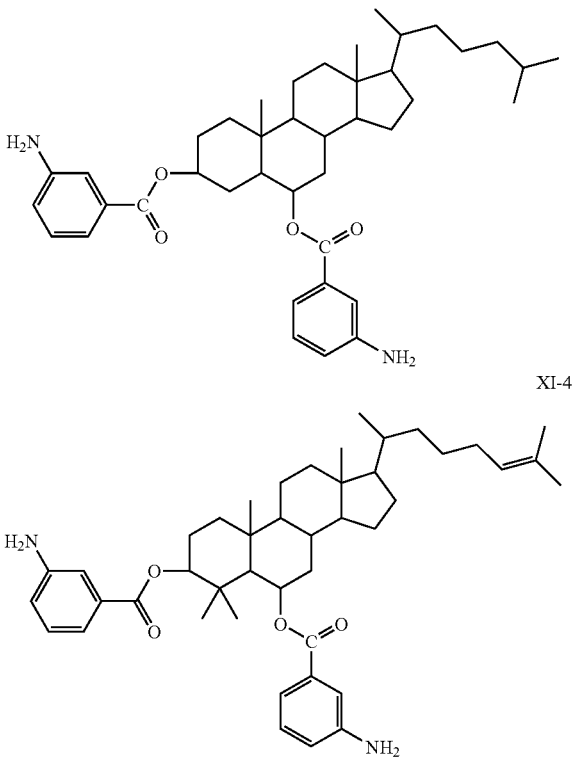

In Formula (XII) above, the two "$NH_2$—($R^{14}$—)Ph-$A^6$-O—" groups are respectively bonded onto carbons of the benzene ring, preferably in meta or para position with respect to the carbon bonded with steroid nucleus. Furthermore, the two amino groups are respectively bonded onto carbons of the benzene ring, preferably in meta or para position with respect to $A^6$.

For diamine of Formula (XII), diamines of Formulas (XII-1)-(XII-8) below can be exemplified.

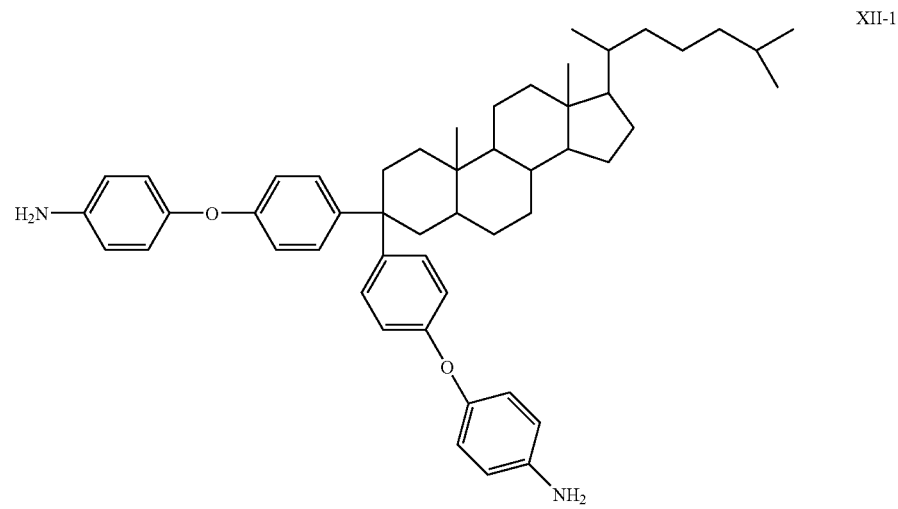

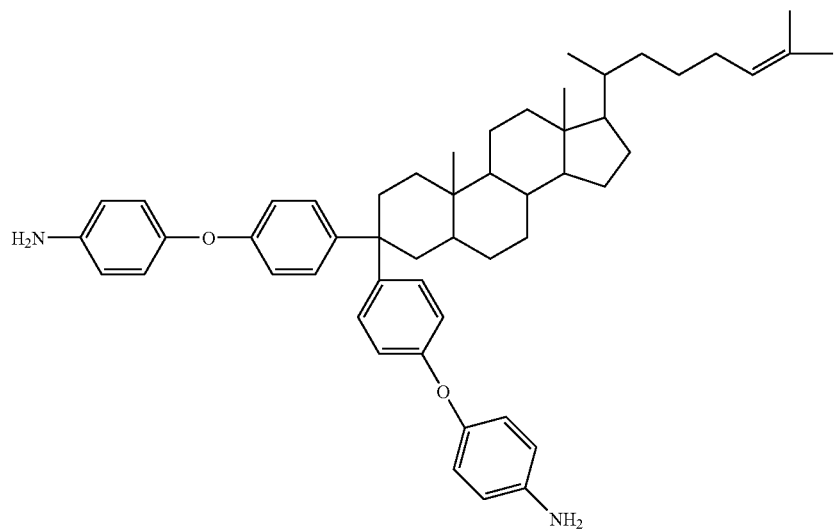
XII-2
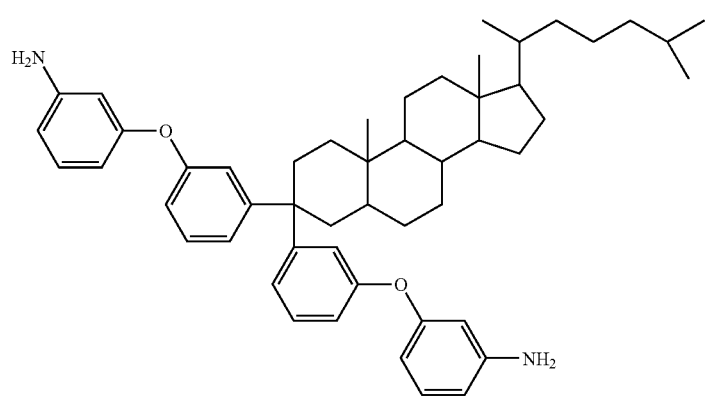
XII-3
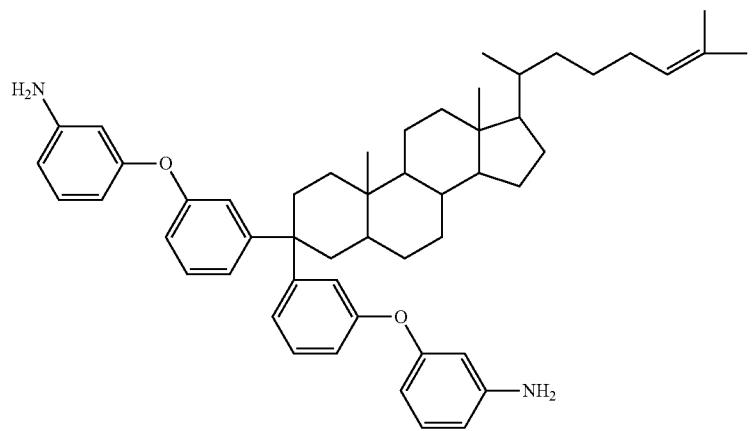
XII-4

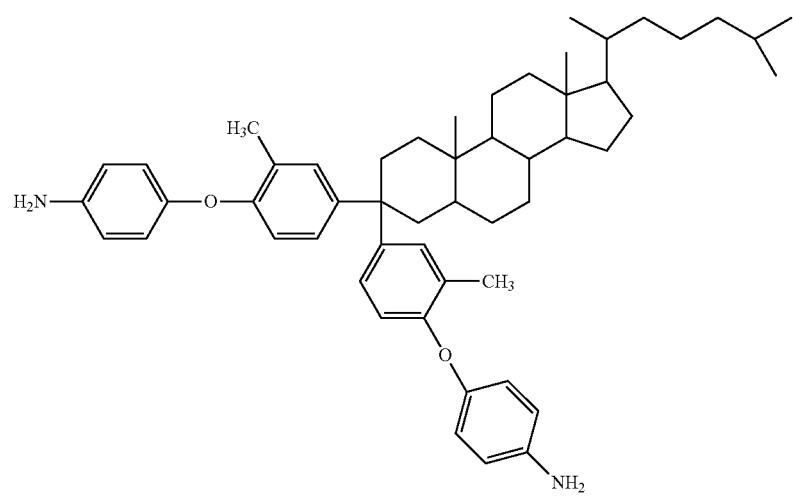
XII-5
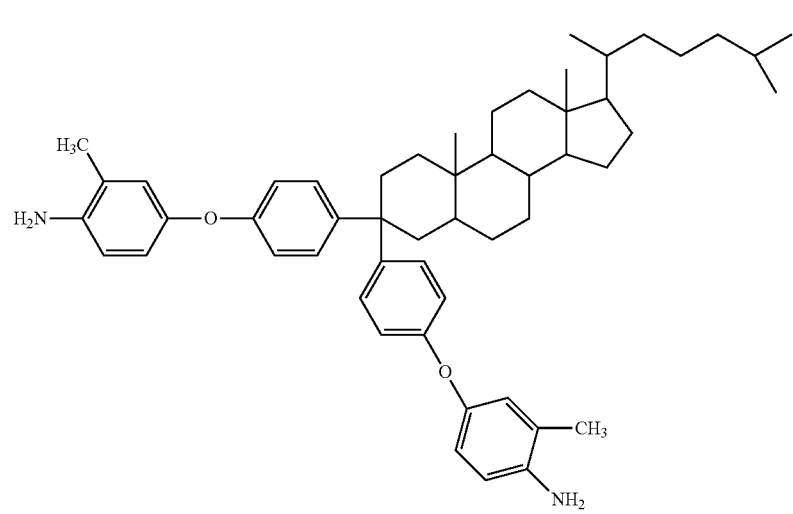
XII-6
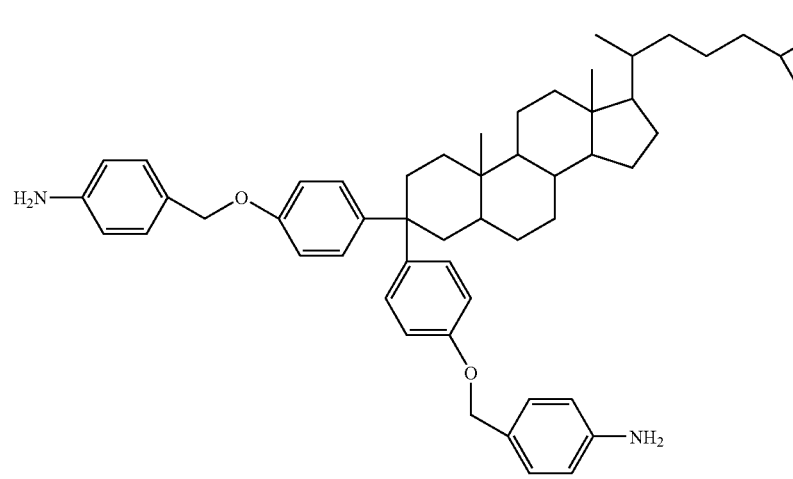
XII-7

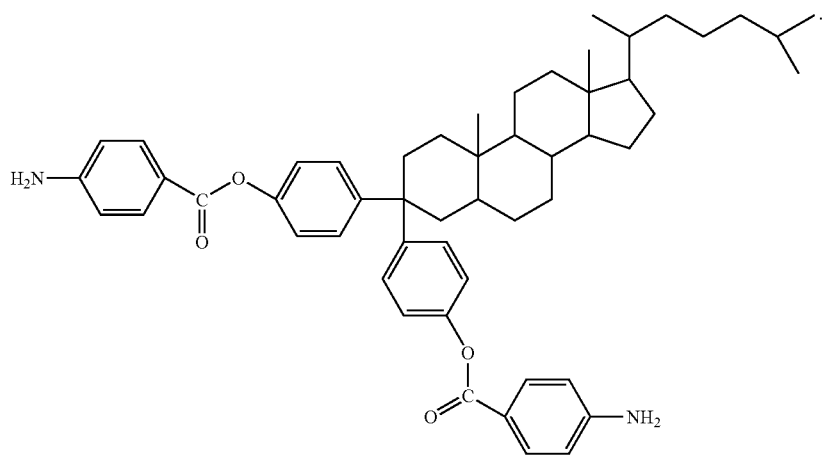

XII-8

Examples of the diamine (a2) for synthesizing polyamic acid (A) further include the compounds of Formula (XIII) and (XIV) below.

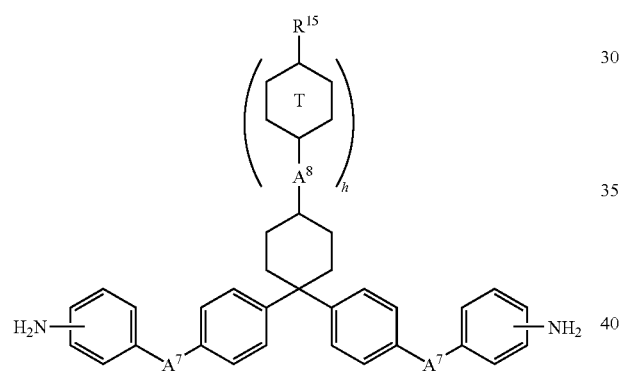

(XIII)

In Formula (XIII), $R^{15}$ is —H or an alkyl group having 1-20 carbon atoms, among the alkyl groups, any —CH$_2$— of the alkyl group having 2-20 carbon atoms can be replaced by —O—, —CH=CH—, or —C≡C—, each $A^7$ is independently —O— or an alkylene group having 1-6 carbon atoms, $A^8$ is a single bond, or an alkylene group having 1-3 carbon atoms, ring T is 1,4-phenylene or 1,4-cyclohexylene, and h is 0 or 1.

(XIV)

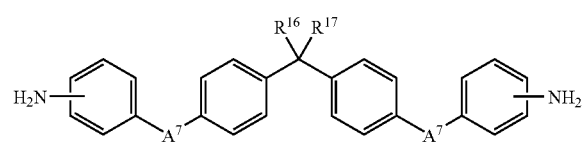

In Formula (XIV), $R^{16}$ is an alkyl group having 2-30 carbon atoms, and preferably an alkyl group having 6-20 carbon atoms. $R^{17}$ is —H or an alkyl group having 1-30 carbon atoms, and preferably an alkyl group having 1-10 carbon atoms. Each $A^7$ is independently —O— or an alkylene group having 1-6 carbon atoms.

In Formula (XIII), the two amino groups are respectively bonded onto carbons of the benzene ring, preferably in meta or para position with respect to $A^7$.

For diamine of Formula (XIII), diamines of Formulas (XIII-1)-(XIII-9) can be exemplified.

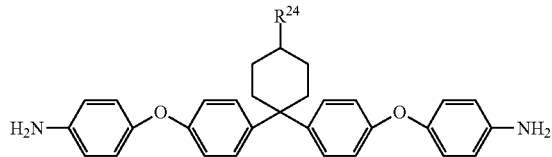

XIII-1

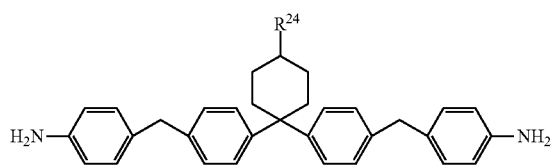

XIII-2

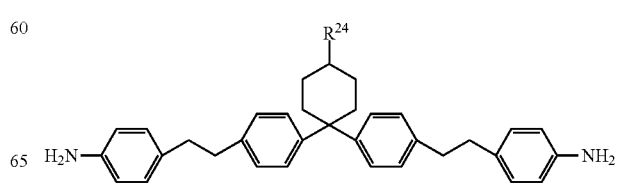

XIII-3

XIII-4

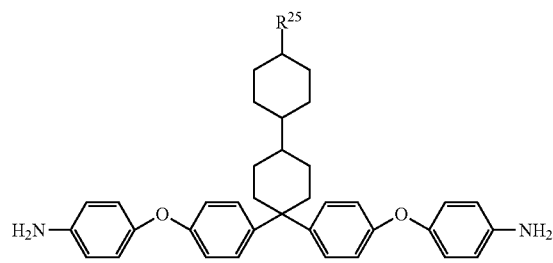

XIII-5

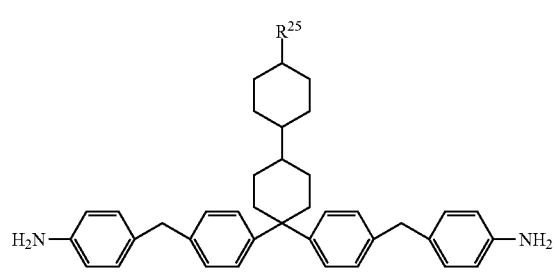

XIII-6

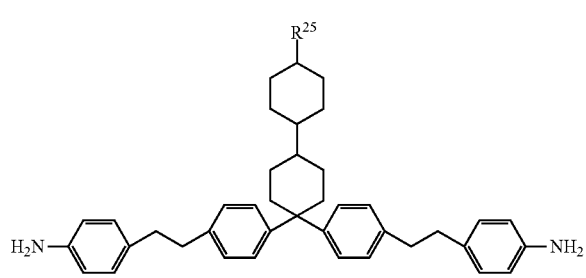

XIII-7

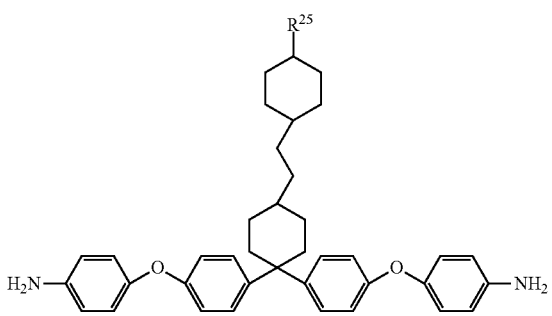

XIII-8

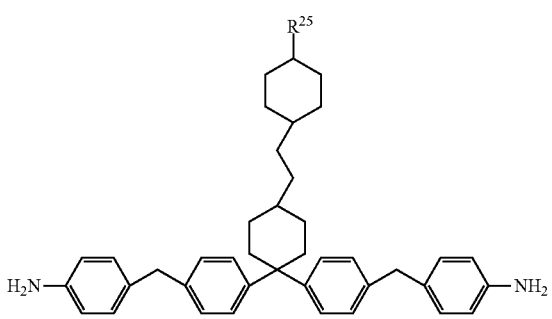

XIII-9

In Formulas (XIII-1)-(XIII-3), $R^{24}$ is preferably —H and an alkyl group having 1-20 carbon atoms, and in Formulas (XIII-4)-(XIII-9), $R^{25}$ is more preferably —H, and an alkyl group having 1-10 carbon atoms.

In Formula (XIV), the two amino groups are respectively bonded onto carbons of the benzene ring, preferably in meta or para position with respect to $A^7$.

For diamine of Formula (XIV), diamines of Formulas (XIV-1)-(XIV-3) can be exemplified.

XIV-1

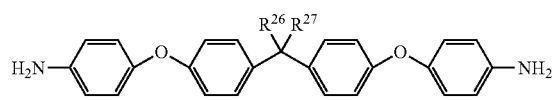

XIV-2

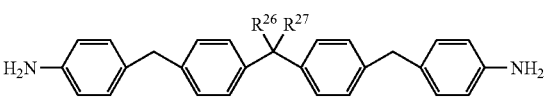

XIV-3

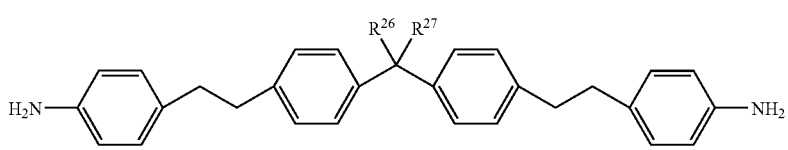

In Formulas (XIV-1)-(XIV-3), $R^{26}$ is an alkyl group having 2-30 carbon atoms, and preferably an alkyl group having 6-20 carbon atoms; and $R^{27}$ is —H or an alkyl group having 1-30 carbon atoms, and preferably —H or an alkyl group having 1-10 carbon atoms.

As described above, diamine (a2) for synthesizing polyamic acid (A) can be the diamines of Formulas (II)-(XIV), or other diamines can be used. For example, naphthalene diamine having naphthalene structure, fluorene diamine having fluorene structure, or siloxane diamine having siloxane bond can be used alone or in admixture with other diamines.

Siloxane diamine is not specifically limited, and siloxane diamine of Formula (XV) below is preferably used.

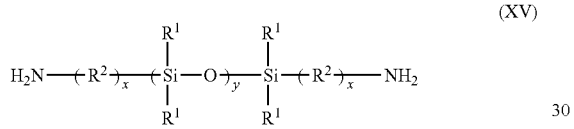

(XV)

In Formula (XV), each $R^1$ is independently an alkyl group having 1-3 carbon atoms, or phenyl, each $R^2$ is independently methylene, phenylene, or phenylene substituted with alkyl, each x is independently an integer of 1-6, and each y is independently an integer of 1-70. Herein, y is more preferably an integer of 1-15.

Thereby, the diamine (a2) for synthesizing polyamic acid (A) can be the diamine of Formulas (XVI-1)-(XVI-8) below.

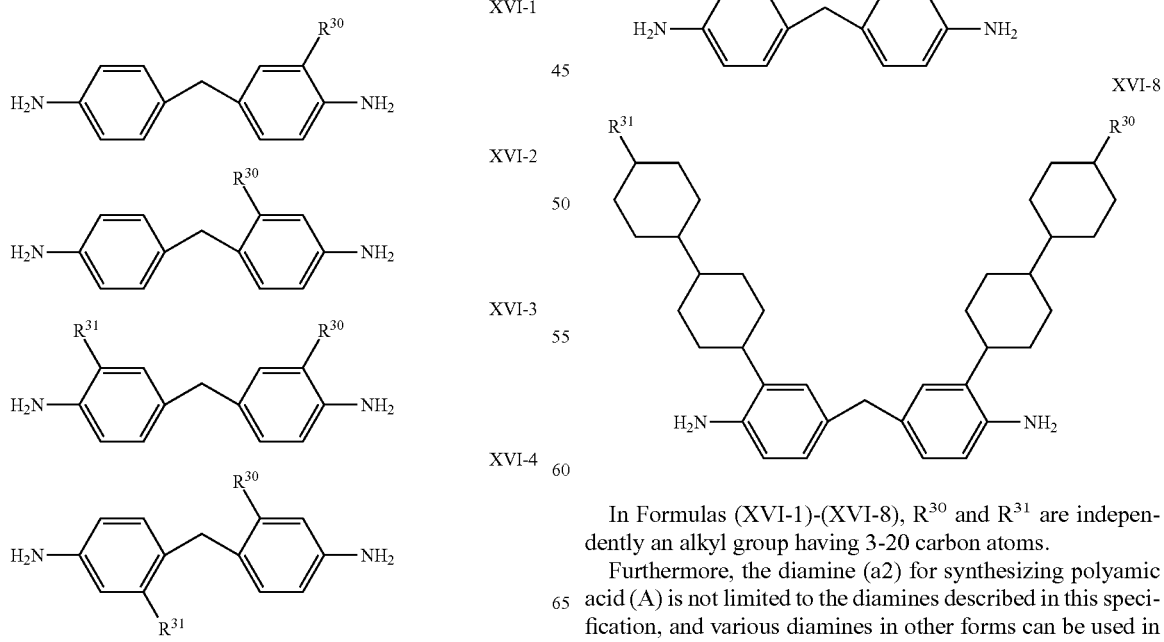

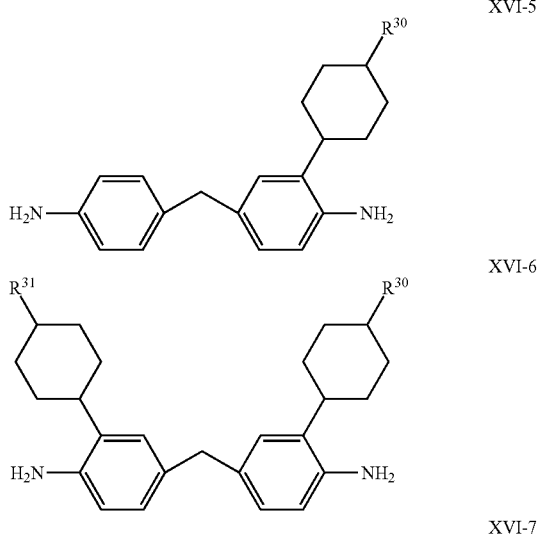

In Formulas (XVI-1)-(XVI-8), $R^{30}$ and $R^{31}$ are independently an alkyl group having 3-20 carbon atoms.

Furthermore, the diamine (a2) for synthesizing polyamic acid (A) is not limited to the diamines described in this specification, and various diamines in other forms can be used in the scope of achieving the object of the present invention.

Moreover, the diamine (a2) for synthesizing polyamic acid (A) can be used alone or in combination of two or more diamine (a2). The combination of two or more diamine (a2) can be the combination of diamines with one another, the combination of diamines with other diamines, or the combination of other diamines with one another.

Furthermore, for the purpose of making the polyimide film formed by the inkjet ink has strong mechanical strength, an aromatic diamine having two amino groups bonded onto the benzene ring in para position with respect to each other, or an aromatic diamine having a structure formed by linking two anilines at position 4 via a divalent organic group, is most preferred.

Specific examples of the aromatic diamine having two amino groups bonded onto the benzene ring in para position with respect to each other include: the aromatic diamine of Formula (V-1), and Formulas (V-3)-(V-5). Specific examples of aromatic diamine having a structure formed by linking two anilines at position 4 via a divalent organic group include: the aromatic diamine represented by Formula (VI-1), Formula (VI-7), Formulas (VI-10)-(VI-13), Formula (VI-27), Formulas (VII-1)-(VII-6), Formulas (VIII-1)-(VIII-11), Formula (XI-1), Formula (XI-2), Formula (XII-1), Formula (XII-2), Formula (XII-5), Formula (XII-7), Formula (XII-8), Formulas (XIII-1)-(XIII-9), and Formulas (XIV-1)-(XIV-3). The aromatic diamine of Formula (V-1), Formulas (V-3)-(V-5), Formula (VI-1), Formula (VI-7), Formulas (VI-10)-(VI-13), and Formula (VI-27) are most preferred.

Furthermore, when the amic acid compound (B1) contains silicon, the silicon can be from the compound (a3) having two or more anhydride groups, and can also be from the monoamine (a5), or from the both. In the following detailed description, the silicon containing amic acid compound is prepared from silicon containing monoamine (a5). Examples of the silicon containing compound (a3) having two or more anhydride groups include compounds described in Japanese Laid-Open Publication No. 1986-205285, Japanese Laid-Open Publication No. 1993-271245, or Japanese Laid-Open Publication No. 1993-320172.

Amic acid compound (B1) can be a compound of Formula (6) below, and preferably compounds of Formula (6-1), Formula (6-2), or Formula (6-3) below.

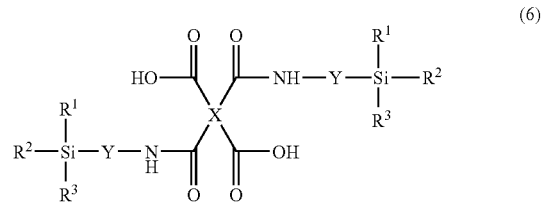

In Formula (6), X is a quadrivalent organic group having 2-100 carbon atoms, $R^1$, $R^2$ and $R^3$ are hydrogen, halogen or a monovalent organic group, and can be identical or different, and Y is an organic group having 1-20 carbon atoms.

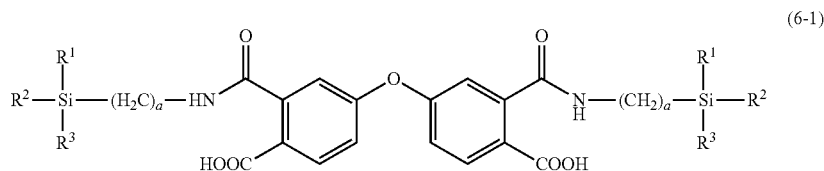

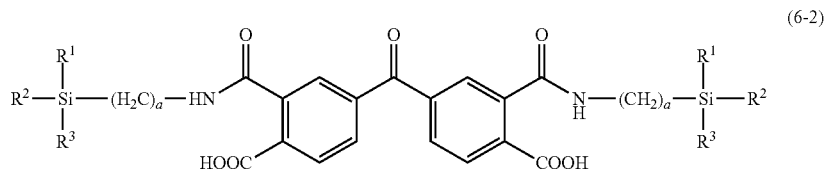

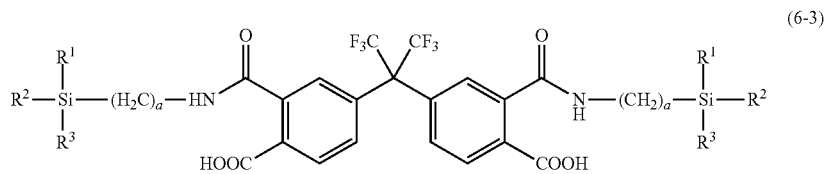

1.2 Amic Acid Compounds (B1 and B2)

The amic acid compound (B1) can at least be prepared from a compound (a3) having two or more anhydride groups and a monoamine (a5), for example, the product of the reaction of these compounds, and can also be the salt compounds formed by these compounds. If the amic acid compound (B1) is an amic acid compound prepared from the compound (a3) having two or more anhydride groups and the monoamine (a5), it is not limited to the amic acid compounds described above.

In Formula (6-1), Formula (6-2), or Formula (6-3), at least one of $R^1$, $R^2$, and $R^3$ contains an alkoxy having 1-20 carbon atoms, and a is an integer of 1-20.

Moreover, the amic acid compound (B2) can at least be prepared from a diamine (a4) and a compound (a6) having one anhydride group, for example, the product of the reaction of these compounds, and can also be the salt compounds formed by these compounds. If the amic acid compound (B2) is an amic acid compound prepared from the diamine (a4) and the compound (a6) having one anhydride group, it is not limited to the amic acid compounds described above.

Furthermore, when the amic acid compound (B2) contains silicon, the silicon can be from the diamine (a4), and can also be from the compound (a6) having one anhydride group, or from the both. In the following detailed description, the silicon containing amic acid compound is prepared from the silicon containing compound (a6) having one anhydride group. Examples of the silicon containing diamine include the siloxane diamine of Formula (XV).

The amic acid compound (B2) includes the compound of Formula (7) below, and preferably the compounds of Formula (7-1), Formula (7-2), Formula (7-3), Formula (7-4), or Formula (7-5) below.

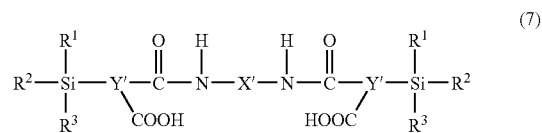

In Formula (7), $R^1$, $R^2$, and $R^3$ are hydrogen, halogen, or a monovalent organic group, and can be identical or different, $Y^1$ is an organic group having 1-20 carbon atoms, and X' is an organic group having 2-100 carbon atoms.

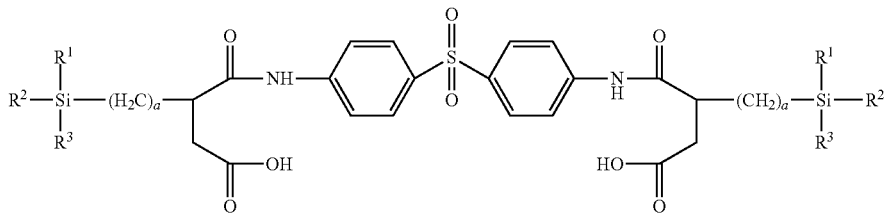

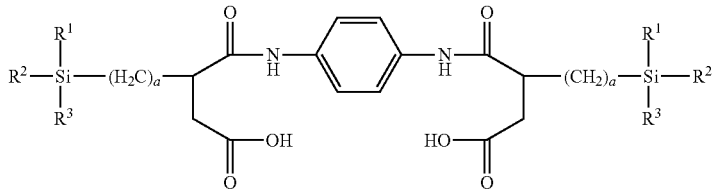

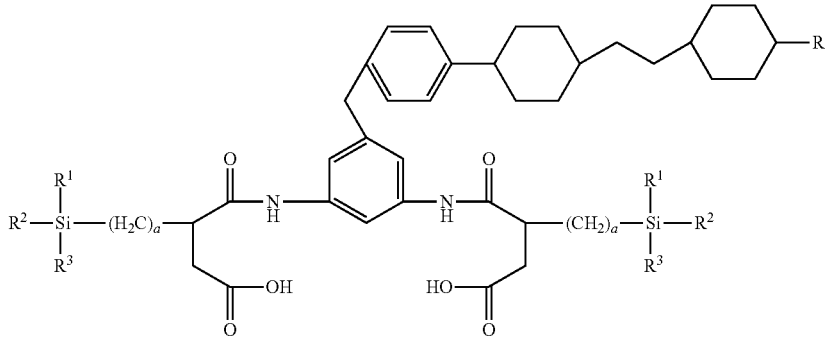

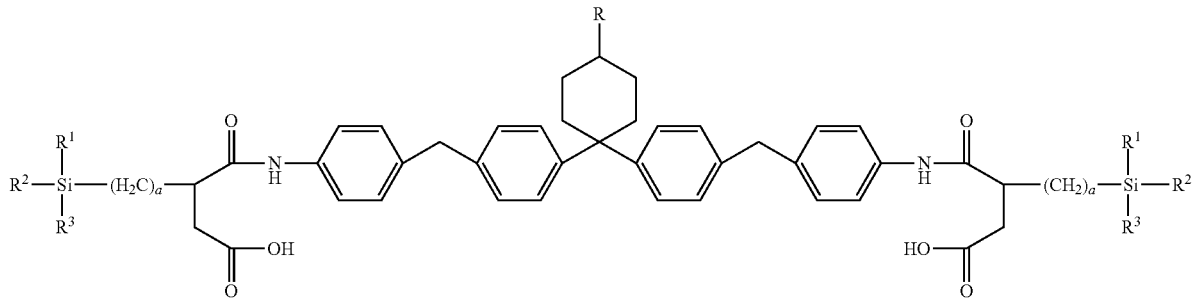

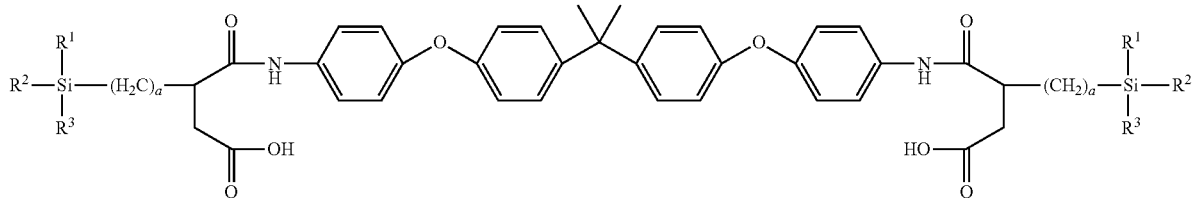

(7-5)

In Formula (7-1), Formula (7-2), Formula (7-3), Formula (7-4), or Formula (7-5), at least one of $R^1$, $R^2$, and $R^3$ contains an alkoxy group having 1-20 carbon atoms, R in Formula (7-3) is an organic group having 2-30 carbon atoms, R in Formula (7-4) is hydrogen or an alkyl group having 1-20 carbon atoms, and a is an integer of 1-20.

1.2.1 Reaction Conditions for Preparing Amic Acid Compounds (B1 and B2)

The amic acid compound (B1) is preferably prepared by reacting 0.5-8.0 mole of the monoamine (a5) with 1 mole of the compound (a3) having two or more anhydride groups. Moreover, the amic acid compound (B1) is more preferably prepared by reacting 1.0-4.0 mole of the monoamine (a5) with 1 mole of the compound (a3) having two or more anhydride groups. The amic acid compound (B1) is especially preferably be prepared by reacting 1.5-2.5 mole of the monoamine (a5) with 1 mole of the compound (a3) having two or more anhydride groups.

The amic acid compound (B2) is preferably prepared by reacting 0.5-8.0 mole of the compound (a6) having one anhydride group with 1 mole of the diamine (a4). Furthermore, the amic acid compound (B2) is more preferably prepared by reacting 1.0-4.0 mole of the compound (a6) having one anhydride group with 1 mole of the diamine (a4). The amic acid compound (B2) is especially preferably prepared by reacting 1.5-2.5 mole of the compound (a6) having one anhydride group with 1 mole of the diamine (a4).

1.2.2 Reaction Solvent

The solvent for preparing the amic acid compounds (B1 and B2) is not specifically limited, as long as the amic acid compound can be synthesized. For example, the same solvents as those used to synthesize polyamic acid (A) can be used. Specific examples of the reaction solvent include: diethylene glycol dimethyl ether, diethylene glycol diethyl ether, diethylene glycol methyl ethyl ether, diethylene glycol monoethyl ether acetate, ethylene glycol monoethyl ether acetate, propylene glycol monomethyl ether acetate, methyl 3-methoxypropionate, ethyl 3-ethoxypropionate, cyclohexanone, γ-butyrolatone, N-methyl-2-pyrrolidone, N,N-dimethylacetamide, and the like.

Among these solvents, propylene glycol monomethyl ether acetate, methyl 3-methoxypropionate, cyclohexanone, diethylene glycol methyl ethyl ether, diethylene glycol dimethyl ether, and γ-butyrolatone are preferred, as the ink having low damage to ink jet head can be prepared.

The reaction solvents can be used alone, or in the form of mixed solvent formed by mixing two or more solvents. Furthermore, in addition to the reaction solvents described above, other solvents can be mixed and used.

When the total amount of the compound (a3) having two or more anhydride groups and the monoamine (a5) is 100 weight parts, or when the total amount of the diamine (a4) and the compound (a6) having one anhydride group is 100 weight parts, the amount of the reaction solvent is preferably 100 weight parts or above, and the reaction can be smooth carried out. The reaction is preferably carried out at 0° C.-100° C. (preferably 8° C.-70° C.) for 0.2-20 hours (preferably 2-10 hours).

1.2.3 Addition Order to Reaction System

Furthermore, the addition order of the reaction raw materials to the reaction system is not specifically limited. Namely, any one of the following methods can be used for preparing the amic acid compound (B1): simultaneously adding the compound (a3) having two or more anhydride groups and the monoamine (a5) into the reaction solvent; dissolving the monoamine (a5) into the reaction solvent, followed by the addition of the compound (a3) having two or more anhydride groups; and adding the monoamine (a5) into the compound (a3) having two or more anhydride groups.

Moreover, any one of the following methods can be used for preparing the amic acid compound (B2): simultaneously adding the diamine (a4) and the compound (a6) having one anhydride group into the reaction solvent; dissolving the diamine (a4) into the reaction solvent, followed by the addition of the compound (a6) having one anhydride group; and adding the diamine (a4) into the compound (a6) having one anhydride group.

1.2.4 Concentration of Amic Acid Compounds (B1 and B2)

The total concentration of the amic acid compounds (B1 and B2) in the inkjet ink is preferably 5 wt %-50 wt %, more preferably 10 wt %-45 wt %, and most preferably 15 wt %-40 wt %. If in this concentration range, the viscosity of the inkjet ink can be adjusted to be in the range suitable for inkjet printing.

1.2.5 Advantages of Amic Acid Compounds (B1 and B2)

It is known that if the silicon containing amic acid compound (B1) is used in combination with epoxy resin and phenol resin, the function of the silane coupling agent can be propitious. The silane coupling agent reacts with a metal or forms a complex; thus, the adhesion of the film and the solder crack resistance are improved. Moreover, it can be predicted that if the silicon containing amic acid compound (B2) is used in combination with epoxy resin and phenol resin, the function of the silane coupling agent can be propitious. The silane coupling agent reacts with a metal or forms a complex; thus, the adhesion of the film and the solder crack resistance are improved.

Furthermore, the inventors found through hard work that the silicon containing amic acid compound (B1) is a thermosetting compound prepared by hydrolyzing, dehydrated and condensed through heating, for forming a solid product (polyimide) having an imide bond. It was further found that the silicon containing amic acid compound (B2) is also a thermosetting compound prepared by hydrolyzing, dehydrated and condensed through heating, for forming a solid product (polyimide) having an imide bond.

A film can be prepared from the silicon containing amic acid compound through three dimensional cross linking of the silicon compound, so the silicon containing amic acid compound is more easier to be processed, compared with the linear polyimide in prior art. Furthermore, the silicon containing amic acid compound has excellent properties as the matrix resin of molded material or laminated material, due to its good thermal resistance and almost no occurrence of voids or cracks in hardening.

1.2.6 Compound (a3) Having Two or More Anhydride Groups

The same compound as the compound (a1) having two or more anhydride groups can be used as the compound (a3) having two or more anhydride groups for synthesizing the amic acid compound (B1).

1.2.7 Diamine (a4)

The same diamine as the diamine (a2) can be used as the diamine (a4) for synthesizing the amic acid compound (B2).

1.2.8 Monoamine (a5)

The monoamine (a5) for synthesizing the amic acid compound (B1) is not specifically limited provided that it has one amino group, the amino silane compound of Formula (4) can be exemplified. Specific examples of the amino silane compound include: 3-aminopropyltrimethoxysilane, 3-aminopropyltriethoxysilane, 3-aminopropylmethyldimethoxysilane, 3-aminopropylmethyldiethoxysilane, 4-aminobutyltrimethoxysilane, 4-aminobutyltriethoxysilane, 4-aminobutylmethyldiethoxysilane, p-aminophenyltrimethoxysilane, p-aminophenyltriethoxysilane, p-aminophenylmethyldimethoxysilane, p-aminophenylmethyldiethoxysilane, m-aminophenyltrimethoxysilane, m-aminophenyltriethoxysilane, m-aminophenylmethyldiethoxysilane, and the like. Specific examples of the amino silane compound further include: 2-aminobenzoic acid, 3-aminobenzoic acid, 4-aminobenzoic acid, monoethanolamine, n-butyl amine, aniline, and the like.

Among these monoamine, as for excellent durability of the resulting film, 3-aminopropyltrimethoxysilane, 3-aminopropyltriethoxysilane, and p-aminophenyltrimethoxysilane are preferred, and 3-aminopropyltriethoxysilane is most preferred. The monoamines can be used alone or in combination of two or more monoamines.

1.2.9 Compound (a6) Having One Anhydride Group

The compound having one anhydride group for synthesizing the amic acid compound (B2) is not specifically limited provided that it has one anhydride group, the silicon containing carboxylic anhydride of Formula (5) and Formula (5') below can be exemplified.

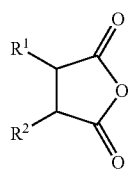

(5')

In Formula (5'), $R^1$ is a silicon containing organic group having 2-100 carbon atoms, $R^2$ is an organic group having 2-100 carbon atoms, and $R^1$ and $R^2$ can be bonded with each other to form a ring.

Among these silicon containing carboxylic anhydrides, p-(trimethoxysilyl)phenylsuccinic anhydride, p-(triethoxysilyl)phenylsuccinic anhydride, m-(trimethoxysilyl)phenylsuccinic anhydride, m-(triethoxysilyl)phenylsuccinic anhydride, trimethoxysilylpropylsuccinic anhydride, triethoxysilylpropylsuccinic anhydride, methyldimethoxysilylpropylsuccinic anhydride, methyldiethoxysilylpropylsuccinic anhydride, trimethoxysilylbutylsuccinic anhydride, triethoxysilylbutylsuccinic anhydride, methyldiethoxysilylbutylsuccinic anhydride, p-(methyldimethoxysilyl)phenylsuccinic anhydride, p-(methyldiethoxysilyl)phenylsuccinic anhydride, m-(methyldiethoxysilyl)phenylsuccinic anhydride, and those of Formula (5-1) and Formula (5-2) below are preferred.

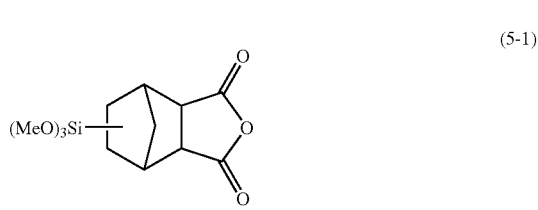

(5-1)

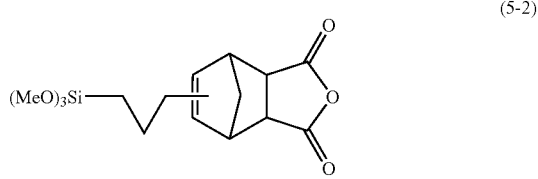

(5-2)

The compound of Formula (5-1) can be prepared, for example, by reacting 5-norbornenyl-2,3-dicarboxylic anhydride with trimethoxysilane. Furthermore, the compound of Formula (5-2) can be prepared, for example, by reacting allyl nadic anhydride with trimethoxysilane.

1.3 Solvent (C)

The inkjet ink can be prepared, for example, by dissolving the polyamic acid (A) and the amic acid compound (B1 and/or B2) into the solvent (C). Therefore, the solvent contained in the inkjet ink is not specifically limited, as long as it can dissolve the polyamic acid (A) and the amic acid compound (B1 and/or B2). Furthermore, if a solvent alone cannot dissolve the polyamic acid (A) and the amic acid compound (B1 and/or B2), it can be combined with other solvents, to serve as the solvent (C) contained in the inkjet ink.

Specific examples of the solvent (C) contained in the inkjet ink include: N-methyl-2-pyrrolidone, dimethyl imidazolidinone, N-methyl caprolactam, N-methylpropionamide, N,N-dimethylacetamide, dimethyl sulfoxide, N,N-dimethylformamide, N,N-diethylformamide, diethylacetamide, γ-butyrolatone, ethyl lactate, 3-methyl-3-methoxybutyl alcohol, tetralin, isophorone, ethylene glycol monobutyl ether, diethylene glycol monoethyl ether, diethylene glycol monoethyl ether acetate, diethylene glycol dimethyl ether, diethylene glycol methyl ethyl ether, triethylene glycol monoethyl ether, propylene glycol monobutyl ether, propylene glycol monomethyl ether acetate, dipropylene glycol monomethyl ether, methyl 3-methoxypropionate, ethyl 3-ethoxypropionate, diethyl malonate, ethanol, 2-propyl alcohol, dioxane, ethylene glycol, and the like.

Among these solvents, for example, as for improving the durability of the inkjet head, ethyl lactate, ethylene glycol monobutyl ether, diethylene glycol monoethyl ether acetate, diethylene glycol dimethyl ether, diethylene glycol methyl ethyl ether, propylene glycol monomethyl ether acetate, methyl 3-methoxypropionate and γ-butyrolatone are preferably contained to serve as the solvent (C).

Furthermore, based on the total weight of the solvent (C), the amount of the amide solvents is preferably 20 wt % or below, and more preferably no amide solvent is contained at all. Herein, examples of the amide solvents include: N-methylformamide, N,N-dimethylformamide, N,N-diethylformamide, acetamide, N-methylacetamide, N,N-dimethylacetamide, diethylacetamide, N-methylpropionamide, N,N,N',N'-tetramethylurea, 2-pyrrolidone, N-methyl-2-pyrrolidone, ε-caprolactam, N-methylcaprolactam, urethane, and the like. The solvents can be used alone or in admixture of two or more solvents. Moreover, the solvent is preferably added and used in such a manner that the content of the solid ingredients in the inkjet ink is up to 10 wt %-50 wt %.

Moreover, the surface tension of the ink will greatly affect the printability of the inkjet ink; thus, the surface tension of the ink is preferably adjusted to 20 mN/m-45 mN/m, more preferably 27 mN/m-42 mN/m, and most preferably 30 mN/m-40 mN/m. If the surface tension is in the range of 20 mN/m-45 mN/m, the ink meniscus at the ink jet outlet is more stable, and the jetting of ink becomes better.

The selection of the solvent is important for adjusting the surface tension to be in the range of 20 mN/m-45 mN/m. A solvent having a surface tension in the range of 20 mN/m-45 mN/m can be used. A mixture of a solvent having a higher surface tension (e.g., γ-butyrolatone: 43 mN/m) and a solvent having a lower surface tension (e.g., diethylene glycol methyl ethyl ether: 24 mN/m, or ethylene glycol monobutyl ether: 32 mN/m) is preferably used, for fine adjustment of the surface tension of the solvent can be effected.

The total concentration of the solvent (C) in the inkjet ink is preferably 30 wt %-94.5 wt %, more preferably 35 wt %-90 wt %, and most preferably 40 wt %-80 wt %. If in this concentration range, the viscosity of the inkjet ink can be adjusted to be in the range suitable for ink jet printing.

1.4 Water Content in Inkjet Ink

The water content in the inkjet ink is not specifically limited, preferably 10,000 ppm or below, and more preferably 5,000 ppm or below. The water content is preferably as described above, for the inkjet ink is less changeable in viscosity, and has excellent storage stability.

1.5 Additive Added to Inkjet Ink

According to the targeted properties, the inkjet ink can be prepared by: optionally selecting and adding additives, for example, epoxy resin, acrylic resin, surfactant, antistatic agent, coupling agent, and epoxy hardener such as trimellitic acid, pH modifier, rust inhibitor, preservative agent, antimildew agent, antioxidant, anti-reducing agent, evaporation promoter, chelating agent, water soluble polymer, pigment, dye, and the like; and uniformly mixing and dissolving these additives.

1.5.1 Epoxy Resin

The inkjet ink can further contain an epoxy resin. The epoxy resin contained in the inkjet ink is not specifically limited, as long as it has oxirane or oxetane, and preferably a compound having two or more oxiranes.

The concentration of the epoxy resin in the inkjet ink is not specifically limited, preferably 0.1 wt %-20 wt %, and more preferably 1 wt %-10 wt %. If the concentration is in this range, the coating formed by the inkjet ink has excellent thermal resistance, chemical resistance, and good flatness.

Epoxy resin includes, for example: bisphenol A epoxy resin, glycidyl ester type epoxy resin, alicyclic epoxy resin, polymers of monomer having oxirane, copolymers of monomers having oxirane and other monomers, and the like.

Specific examples of the monomer having oxirane include: glycidyl (meth)acrylate, 3,4-epoxycyclohexyl (meth)acrylate, and methyl glycidyl (meth)acrylate.

Furthermore, examples of other monomers copolymerizable with the monomer having oxirane include: (meth)acrylic acid, methyl (meth)acrylate, ethyl (meth)acrylate, isopropyl (meth)acrylate, n-butyl (meth)acrylate, isobutyl (meth)acrylate, t-butyl (meth)acrylate, cyclohexyl (meth)acrylate, benzyl (meth)acrylate, 2-hydroxylethyl (meth)acrylate, 2-hydroxylpropyl (meth)acrylate, styrene, methylstyrene, chloromethylstyrene, (3-ethyl-3-epoxypropyl)methyl (meth) acrylate, N-cyclohexylmaleimide, N-phenylmaleimide, and the like.

Preferred specific examples of the polymers of the monomer having oxirane and the copolymers of the monomer having oxirane with other monomers include: polyglycidyl methacrylate, methyl methacrylate-glycidyl methacrylate copolymer, benzyl methacrylate-glycidyl methacrylate copolymer, n-butyl methacrylate-glycidyl methacrylate copolymer, 2-hydroxylethyl methacrylate-glycidyl methacrylate copolymer, (3-ethyl-3-epoxypropyl)methyl methacrylate-glycidyl methacrylate copolymer, and styrene-glycidyl methacrylate copolymer. The inkjet ink preferably contains these epoxy resins, for the coating formed by the inkjet ink has excellent thermal resistance.

Specific examples of the epoxy resin include: products with trade names of Epikote 807, Epikote 815, Epikote 825, Epikote 827, Epikote 828, Epikote 190P, and Epikote 191P (manufactured by Yuka Shell Epoxy Co., Ltd.); products with trade names of Epikote 1004, and Epikote 1256 (manufactured by Japan Epoxy Resins Co., Ltd); products with trade names of Araldite CY177, and Araldite CY184 (manufactured by Japan Ciba-geigy Corporation); products with trade names of Celloxide 2021P, Celloxide 3000, and EHPE-3150 (manufactured by Diacel Chemical Industries); products with trade name of Techmore VG3101 L (manufactured by Mitsui Chemicals Co., Ltd.); N,N,N',N'-tetraglycidyl-m-xylylenediamine, 1,3-bis(N,N-diglycidylaminomethyl)cyclohexane, N,N,N',N'-tetraglycidyl-4,4'-diaminodiphenylmethane, and the like.

Among these epoxy resins, the products with trade names of Araldite CY184, Celloxide 2021P, Techmore VG3101 L, and Epikote 828 are preferred, for the resulting polyimide film has especially good flatness.

The epoxy resin can be used alone, or in combination of two or more epoxy resins.

1.5.2 Acrylic Resin

The inkjet ink can further contain an acrylic resin. The acrylic resin contained in the inkjet ink is not specifically limited, as long as it has a propenyl group or a methylpropenyl group.

The concentration of the acrylic resin in the inkjet ink is not specifically limited, preferably 0.1 wt %-20 wt %, and more preferably 1 wt %-10 wt %. If the concentration is in this range, the coating formed by the inkjet ink has excellent thermal resistance, chemical resistance, and good flatness.

The acrylic resin includes, for example, monofunctional polymerizable monomer having hydroxyl group, a monofunctional polymerizable monomer having no hydroxyl group, difunctional (meth)acrylate, multifunctional (meth) acrylate having three or more functional groups, and the like.

Specific examples of the monofunctional polymerizable monomer having hydroxyl group include: 2-hydroxylethyl (meth)acrylate, 2-hydroxylpropyl (meth)acrylate, 4-hydroxylbutyl (meth)acrylate, or 1,4-cyclohexanedimethyl alcohol mono(meth)acrylate, and the like. Among these monomers, as for the flexibility of the formed film, 4-hydroxylbutyl acrylate, and 1,4-cyclohexane dimethyl alcohol monoacrylate are preferred.

Specific examples of the monofunctional polymerizable monomer having no hydroxyl group include: glycidyl (meth) acrylate, 3,4-epoxycyclohexyl (meth)acrylate, methylglycidyl (meth)acrylate, 3-methyl-3-(meth)acryloxymethyloxetane, 3-ethyl-3-(meth)acryloxymethyloxetane, 3-methyl-3-

(meth)acryloxyethyloxetane, 3-ethyl-3-(meth)acryloxyethyloxetane, p-vinylphenyl-3-ethyloxetan-3-ylmethyl ether, 2-phenyl-3-(meth)acryloxymethyloxetane, 2-trifluoromethyl-3-(meth)acryloxymethyloxetane, 4-trifluoromethyl-2-(meth)acryloxymethyloxetane, (meth)acrylic acid, methyl (meth)acrylate, ethyl (meth)acrylate, isopropyl (meth)acrylate, butyl (meth)acrylate, isobutyl (meth)acrylate, t-butyl (meth)acrylate, cyclohexyl (meth)acrylate, benzyl (meth)acrylate, styrene, methylstyrene, chloromethylstyrene, (3-ethyl-3-epoxypropyl)methyl (meth)acrylate, N-cyclohexylmaleimide, N-phenylmaleimide, vinyltoluene, (meth)acrylamide, tricyclo[$5.2.1.0^{2,6}$]decyl (meth)acrylate, dicyclopentenyloxyethyl (meth)acrylate, isobornyl (meth)acrylate, phenyl (meth)acrylate, glyceryl mono(meth)acrylate, polystyrene macromonomer, polymethyl methacrylate macromonomer, N-acryloylmorpholine, (meth)acrylate-5-tetrahydrofurfuryloxycarbonylpentyl, (meth)acrylate of ethylene oxide adduct of lauryl alcohol, methacrylic acid, crotonic acid, α-chloroacrylic acid, cinnamic acid, maleic acid, fumaric acid, itaconic acid, citraconic acid, mesaconic acid, co-carboxyl polycaprolactone mono(meth)acrylate, mono[2-(meth)acryloxyethyl]succinate, mono[2-(meth)acryloxyethyl]maleate, or mono[2-(meth)acryloxyethyl]cyclohexene-3,4-dicarboxylate, and the like.

Specific examples of the difunctional (meth)acrylate mentioned include: diacrylate modified by bisphenol F ethylene oxide, diacrylate modified by bisphenol A ethylene oxide, diacrylate modified by isocyanuric acid ethylene oxide, polyethylene glycol diacrylate, polypropylene glycol diacrylate, pentaerythritol diacrylate, pentaerythritol diacrylate monostearate, 1,4-butanediol diacrylate, 1,6-hexanediol diacrylate, 1,9-nonanediol diacrylate, 1,4-cyclohexanedimethanol diacrylate, 2-n-butyl-2-ethyl-1,3-propaneol diacrylate, trimethylolpropane diacrylate, or dipentaerythritol diacrylate, and the like.

Specific examples of the multifunctional (meth)acrylate having three or more functional groups include: trimethylolpropane tri(meth)acrylate, trimethylolpropane tri(meth)acrylate modified by ethylene oxide, trimethylolpropane tri(meth)acrylate modified by propylene oxide, trimethylolpropane tri(meth)acrylate modified by epichlorohydrin, di(trimethylolpropane) tetra(meth)acrylate, glyceryl tri(meth)acrylate, glyceryl tri(meth)acrylate modified by epichlorohydrin, diglyceryl tetra(meth)acrylate, pentaerythritol tri(meth)acrylate, pentaerythritol tetra(meth)acrylate, dipentaerythritol penta(meth)acrylate, dipentaerythritol penta(meth)acrylate modified by alkyl, dipentaerythritol tetra(meth)acrylate modified by alkyl, dipentaerythritol tri(meth)acrylate modified by alkyl, dipentaerythritol hexa(meth)acrylate, dipentaerythritol hexa(meth)acrylate modified by caprolactone, tri(meth)acrylate phosphate modified by ethylene oxide, tri[(meth)acryloxyethyl] isocyanurate, tri[(meth)acryloxyethyl] isocyanurate modified by caprolactone, or urethane (meth)acrylate, and the like.

The acrylic resins can be used alone, or in admixture of two or more acrylic resins.

1.5.3 Surfactant

A surfactant can be added to improve the printability of the inkjet ink. Specific examples of the surfactant include silicon-based surfactants with trade names of Byk-300, Byk-306, Byk-335, Byk-310, Byk-341, Byk-344, and Byk-370 (manufactured by BYK-Chemie Co. Ltd.); acrylic surfactants with trade names of Byk-354, ByK-358, and Byk-361 (manufactured by BYK-Chemie Co. Ltd); and fluorine-based surfactant with trade names of DFX-18, Ftergent 250, and Ftergent 251 (manufactured by Neos Co. Ltd.).

The surfactants can be used alone, or in admixture of two or more surfactants.

The surfactants are used to improve the wetting capability, leveling capability, or printability to the base substrate, and the amount of the surfactants is preferably 0.01-1 weight part based on 100 weight parts of the inkjet ink.

1.5.4 Antistatic Agent

The antistatic agent is not specifically limited, and antistatic agent known in the art can be used. Specific examples of the antistatic agent include: metal oxide, such as tin oxide, tin oxide-antimony oxide complex, and tin oxide-indium oxide complex, or quaternary ammonium, and the like.

The antistatic agents can be used alone, or in admixture of two or more antistatic agents.

The antistatic agents are used to inhibit the static, and the amount of the antistatic agent is preferably 0.01-1 weight part based on 100 weight parts of the inkjet ink.

1.5.5 Coupling Agent

The coupling agent is not specifically limited, and coupling agents known in the art can be used. The added coupling agent is preferably silane coupling agent, and specific examples of the coupling agent include: trialkoxysilane compound or dialkoxysilane compound, and the like. The preferred coupling agent is exemplified by γ-vinylpropyltrimethoxysilane, γ-vinylpropyltriethoxysilane, γ-acryloylpropylmethyldimethoxysilane, γ-acryloylpropyltrimethoxysilane, γ-acryloylpropylmethyldiethoxysilane, γ-acryloylpropyltriethoxysilane, γ-methacryloylpropylmethyldimethoxysilane, γ-methacryloylpropyltrimethoxysilane, γ-methacryloylpropylmethyldiethoxysilane, γ-methacryloylpropyltriethoxysilane, γ-glycidoxypropylmethyldimethoxysilane, γ-glycidoxypropyltrimethoxysilane, γ-glycidoxypropylmethyldiethoxysilane, γ-glycidoxypropyltriethoxysilane, γ-aminopropylmethyldimethoxysilane, γ-aminopropyltrimethoxysilane, γ-aminopropylmethyldimethoxysilane, γ-aminopropyltriethoxysilane, N-aminoethyl-γ-iminopropylmethyldimethoxysilane, N-aminoethyl-γ-aminopropyltrimethoxysilane, N-aminoethyl-γ-aminopropyltriethoxysilane, N-phenyl-γ-aminopropyltrimethoxysilane, N-phenyl-γ-aminopropyltriethoxysilane, N-phenyl-γ-aminopropylmethyldimethoxysilane, N-phenyl-γ-aminopropylmethyldiethoxysilane, γ-mercaptopropylmethyldimethoxysilane, γ-aminopropyltrimethoxysilane, γ-mercaptopropylmethyldiethoxysilane, γ-mercaptopropyltriethoxysilane, γ-isocyanatopropylmethyldiethoxysilane, γ-isocyanatopropyltriethoxysilane, and the like. Among these silanes, preferably mentioned can be: γ-vinylpropyltrimethoxysilane, γ-acryloylpropyltrimethoxysilane, γ-methacryloylpropyltrimethoxysilane, γ-isocyanatopropyltriethoxysilane, and the like.

The coupling agents can be used alone, or in admixture of two or more coupling agents.

The amount of the coupling agent is preferably 0.01-3 weight parts based on 100 weight parts of the inkjet ink.

1.5.6 Epoxy Hardener

The epoxy hardener is not specifically limited, and epoxy hardeners known in the art can be used. Specific examples of the epoxy hardener include: organic acid dihydrazide compound, imidazole and derivatives thereof, dicyanodiamide, aromatic amine, polycarboxylic acid, polycarboxylic anhydride, and the like. More specific examples of the epoxy hardener include: dicyanodiamides, such as dicyanodiamide; organic acid dihydrazides, such as adipic acid dihydrazide and 1,3-bis(hydrazinecarboethyl)-5-isopropylhydantoin; imidazole derivatives, such as 2,4-diamino-6-[2'-ethylimidazolyl-(1')]-ethyltriazine, 2-phenylimidazole, 2-phenyl-4-methylimidazole, 2-phenyl-4-methyl-5-hydroxylmethylimidazole; anhydrides, such as phthalic anhydride, trimellitic annydride, and 1,2,4-cyclohexanetricarboxylic-1,2-anhydride, and the like.

Among the epoxy hardeners, trimellitic annydride and 1,2,4-cyclohexanetricarboxylic-1,2-anhydride having good transparency are preferred.

The epoxy hardeners can be used alone, or in admixture of two or more epoxy hardeners.

The amount of the epoxy hardener is preferably 0.2-5 weight parts based on 100 weight parts of the inkjet ink.

2 Polyimide Film of the Present Invention

The inkjet ink is coated on the surface of substrate by ink jet, and then heated by a hot plate or an oven to form an entire polyimide film or particularly patterned (for example, linearized) polyimide film. Furthermore, the polyimide film is not limited to be formed by heating, and can also be formed by UV processing, or ion beam processing, electron beam processing, and gamma ray processing.

2.1 Coating of Inkjet Ink by Ink Jet Method

Ink jet coating method is diverse in view of the jet manner of the ink. The jet manner includes, for example: piezoelectric element type, bubble-jet (registered trademark) type, continuous injection type, static induction type, and the like. The inkjet ink is jetted through various jet manners by properly selecting the components contained in the ink for coating, so as to form predetermined patterns.

The preferred jet manner for coating with the inkjet ink is piezoelectric element type. The head of the piezoelectric element type is an on-demand ink jet coating head, which is provided with: a nozzle forming board having a plurality of nozzles, pressure generation elements composed of a piezoelectric material and a conductive material which are arranged opposite to the nozzles, and ink filling the circumferences of the pressure generation elements, and the pressure generation elements are deformed by applying an electric voltage and small ink droplets are ejected from the nozzles.

The ink jet coating apparatus is not limited to the apparatus in which the head and an ink storing section are mounted separately, but can be an apparatus in which the head and the ink storing section are integral with each other. Also, the ink storing section may be mounted on a carriage either separately or integrally with regard to the coating head. The ink storing section also may be disposed on a securing section of the inkjet coating apparatus to supply ink to the coating head via an ink supply member, e.g., a tube.

Furthermore, when the ink tank is provided with a construction for exerting preferred negative pressure to the coating head, a construction in which a suction body is placed in an ink storing section of the ink tank or a construction having a flexible ink storing bag and a spring section which generates an urging force in a direction that a capacity of the bag expands can be employed. As for the coating apparatus, the serial coating type described above may be employed as well as a line printer in which coating elements are arranged over an area corresponding to the entire width of the coating medium.

2.2 Formation of Polyamic Acid Film

A polyamic acid film is formed by: coating the inkjet ink on a substrate through the inkjet coating method, heating the inkjet ink by a hot plate or an oven to gasify and remove the solvent (i.e., drying). The heating condition varies depending on the species and formulation proportions of the components, and is generally at 70° C.-120° C., when an oven is used, a polyamic acid film is formed in 5-15 min, and when a hot plate is used, a polyamic acid film is formed in 1-5 min.

2.3 Formation of Polyimide Film

After being formed, the polyamic acid film is heated by an oven for 30-90 min, or heated by an hot plate for 5-30 min at 180° C.-350° C., and preferably 200° C.-300° C. to imidize the polyamic acid, so as to prepare a polyimide film. When the polyamic acid film is formed with patterns, a patterned polyimide film is formed. In this specification, unless otherwise indicated, the polyimide film includes the patterned polyimide film.

3 Film Substrate of the Present Invention

The film substrate of the present invention can be prepared by: for example, coating the inkjet ink on a substrate, such as a polyimide film, with wiring thereon by ink jet coating method to form an entire film or a film with particular patterns (for example, a linearized film), next drying the substrate, and then heating the film, to form a polyimide film.

The polyimide film useful in the present invention has good flexibility. The polyimide film is preferably formed on (but not limited to) a substrate, such as a polyimide film, and also can be formed on a substrate known in the art.

The substrate useful in the present invention includes, for example, printed wiring board, such as glass epoxy substrate, glass composite substrate, paper phenol substrate, paper epoxy substrate, green epoxy substrate, or bismaleimide-triazine resin (BT resin) substrate of various specifications of FR-1, FR-3, FR-4, CEM-3, or E668.

Furthermore, other substrates useful in the present invention include: substrates formed by a metal, such as copper, brass, phosphor bronze, copper beryllium, aluminium, gold, silver, nickel, stannum, chromium, or stainless steel (also substrates having a surface of these metals); substrates formed by ceramics, such as alumina, aluminum nitride, zirconia, zirconium silicate (zircon), magnesia, aluminium titanate, barium titanate, lead titanate (PT), lead zirconate titanate (PZT), lead lanthanum zirconate titanate (PLZT), lithium niobate, lithium tantalate, cadmium sulfide, molybdenum sulfide, beryllia, silica, silicon carbide, silicon nitride, boron nitride, zinc oxide, mullite, ferrite, steatite, forsterite, spinel, or spodumene (also substrates having a surface of these ceramics); substrates formed with resins, such as polyethylene terephthalate (PET) resin, polybutylene terephthalate (PBT) resin, polycyclohexylene dimethylene terephthalate (PCT) resin, polyphenyl sulfide (PPS) resin, polycarbonate resin, polyacetal resin, polyphenylene oxide resin, polyamide resin, polyarylate resin, polysulfone resin, polyethersulfone resin, polyetherimide resin, polyamideimide resin, epoxy resin, acrylic resin, teflon (registered trademark), thermoplastic elastomer, or liquid crystal polymer (also substrates having a surface of these resins); semiconductive substrates, such as silicon, germanium, or galliumarsenium; glass substrate; substrates with an electrode material, such as tin oxide, zinc oxide, indium tin oxide (ITO), or antimony tin oxide (ATO) formed on the surface thereof; or gel plate, such as αGEL, βGEL, θGEL, or γGEL (all are the registered trademarks of Taica Co. Ltd.), and the like.

4 Electronic Components of the Present Invention

For example, the inkjet ink is coated onto a film substrate, such as a polyimide film, with wiring preformed thereon through ink jet coating method, and then the film substrate is dried, and heated, so as to prepare a flexible electronic component covered with an insulation polyimide film.

EXAMPLES

Hereinafter, the present invention is further illustrated with reference to examples and comparative examples, but the present invention is not limited thereto.

Abbreviatory symbols are used to denote the names of the compounds (a1) and (a3) having two or more anhydride groups, the diamines (a2) and (a4), the compound (a6) having one anhydride group, and the solvent (C) used in synthesis examples, examples, or comparative examples. The abbreviatory symbols are used in the following description.

Compounds (a1) and (a3) Having Two or More Anhydride Groups
ODPA: 3,3',4,4'-diphenylethertetracarboxylic dianhydride
6FDA: 2,2-[bis(3,4-dicarboxylphenyl)]hexafluoropropane dianhydride
Diamines (a2) and (a4)
BAPP: 2,2-bis[4-(4-aminophenoxy)phenyl]propane
TPE-R: 1,3-bis(4-aminophenoxy)benzene
Compound (a6) Having One or More Anhydride Groups
TESA: triethoxysilylpropylsuccinic anhydride
Solvent (C)
EDM: diethylene glycol methyl ethyl ether
NMP: N-methyl-2-pyrrolidone
GBL: γ-butyrolatone

Synthesis Example 1

Synthesis of Polyamic Acid (A-1) Solution

The raw materials shown below were charged into a 500 ml four-neck flask equipped with a thermometer, a stirrer, a raw material inlet, and a nitrogen inlet, and then stirred for 5 hours at 25° C. with the presence of dry nitrogen stream, to prepare a light yellow and transparent polyamic acid solution of 12 wt %. The viscosity of the solution was 5100 mPa·s (25° C.). The weight-average molecular weight determined by GPC was 117,000. The solution was used as a polyamic acid (A-1) solution.

The viscosity of the solution was determined by using an E type viscometer (VISCONIC ELD, manufactured by TOKYO KEIKI). Furthermore, the weight-average molecular weight of polyamic acid was determined by: diluting the resulting polyamic acid with tetrahydrofuran (THF), to give a polyamic acid solution having a concentration of about 1 wt %, then testing through GPC method by using GPC apparatus (JASCO GULLIVER 1500 (intelligent differential refractometer) RI-1530, manufactured by JASCO Co. Ltd) with the dilution as a developing solvent, and finally performing polystyrene conversion. Columns G4000HXL, G3000HXL, G2500HXL, and G2000HXL (manufactured by Tosoh Co. Ltd.) were sequentially connected for using. The determination is performed at column temperature of 40° C., and a flow rate of 1.0 ml/min.

| ODPA | 1.03 g |
| BAPP | 1.37 g |
| GBL | 17.60 g |

Synthesis Examples 2-3

Polyamic Acid (A-2)-(A-3) Solutions

The polyamic acid solutions were prepared by using the same conditions as those in Synthesis Example 1, except that the raw materials in table 1 were charged, and was used as polyamic acid (A-2)-(A-3) solutions.

Weight-average molecular weight, and viscosity at 25° C. of the resulting polyamic acid (A-2)-(A-3) solutions were determined by using the same conditions as those in Synthesis Example 1. The results are shown in table 1.

TABLE 1

| | Polyamic Acid (A) | Tetracarboxylic Dianhydride (a1) | Diamine (a2) | Weight-Average Molecular Weight (Mw) | Solvent (C) | Viscosity (mPa·s) |
|---|---|---|---|---|---|---|
| Synthesis Example 1 | (A1) | ODPA (1.03 g) | BAPP (1.37 g) | 117,000 | GBL (17.6 g) | 5,100 |
| Synthesis Example 2 | (A2) | 6FDA (1.25 g) | BAPP (1.15 g) | 207,000 | GBL (17.6 g) | 15,000 |
| Synthesis Example 3 | (A3) | 6FDA (1.81 g) | TPE-R (1.19 g) | 122,000 | NMP (13.5 g) EDM (13.5 g) | 432 |

Synthesis Example 4

Synthesis of Amic Acid Compound (B2) Solution

The raw materials shown below were charged into a 500 ml four-neck flask equipped with a thermometer, a stirrer, a raw material inlet, and a nitrogen inlet, and then stirred for 5 hours at 25° C. with the presence of dry nitrogen stream, to prepare an amic acid compound solution of 40 wt %. The viscosity of the solution was 30.4 mPa·s (25° C.). The solution was used as an amic acid compound (B2) solution.

| BAPP | 4.83 g |
| TESA | 7.17 g |
| EDM | 12.6 g |
| GBL | 5.4 g |

Example 1

Inkjet Ink (1)

The polyamic acid (A-1) solution from Synthesis Example 1, the amic acid compound (B2) solution from Synthesis Example 4, and EDM were mixed according to the composition below, and then the mixture was stirred for 2 hours, to prepare a solution of 24 wt %. The viscosity of the solution was 13.3 mPa·s (25° C.). The solution was directly used as inkjet ink (1).

| Polyamic acid (A-1) solution | 4.0 g |
|---|---|
| Amic acid compound (B2) solution | 6.0 g |
| EDM | 2.0 g |

The composition of the inkjet ink (1) was as follows.

| Polyamic acid (A-1) | 0.48 g |
|---|---|
| Amic acid compound (B2) | 2.40 g |
| Solvent (C) | |
| GBL | 3.52 g |
| EDM | 5.60 g |

Example 2

Inkjet Ink (2)

The polyamic acid (A-2) solution from Synthesis Example 2, the amic acid compound (B2) solution from Synthesis Example 4, and EDM were mixed according to the composition below, and then the mixture was stirred for 2 hours, to prepare a solution of 23 wt %. The viscosity of the solution was 14.0 mPa·s (25° C.). The solution was directly used as inkjet ink (2).

| Polyamic acid (A-2) solution | 3.0 g |
|---|---|
| Amic acid compound (B2) solution | 6.0 g |
| EDM | 3.0 g |

The composition of the inkjet ink (2) was as follows.

| Polyamic acid (A-2) | 0.36 g |
|---|---|
| Amic acid compound (B2) | 2.40 g |
| Solvent (C) | |
| GBL | 3.72 g |
| EDM | 5.52 g |

Example 3

Inkjet Ink (3)

The polyamic acid (A-3) solution from Synthesis Example 3, the amic acid compound (B2) solution from Synthesis Example 4, and EDM were mixed according to the composition below, and then the mixture was stirred for 2 hours, to prepare a solution of 22 wt %. The viscosity of the solution was 10.8 mPa·s (25° C.). The solution was directly used as inkjet ink (3).

| Polyamic acid (A-3) solution | 2.0 g |
|---|---|
| Amic acid compound (B2) solution | 5.0 g |
| EDM | 3.0 g |

The composition of the inkjet ink (3) was as follows.

| Polyamic acid (A-3) | 0.2 g |
|---|---|
| Amic acid compound (B2) | 2.0 g |
| Solvent (C) | |
| NMP | 0.9 g |
| GBL | 0.9 g |
| EDM | 6.0 g |

Comparative Example 1

Inkjet Ink (E1)

The amic acid compound (B2) solution from Synthesis Example 4 was diluted according to the composition below to a viscosity of 20 mPa·s or below, to prepare an inkjet ink (E1). The viscosity of the ink was 14.4 mPa·s, and the concentration of the ink was 30 wt %.

| Amic acid compound (B2) solution | 15 g |
|---|---|
| EDM | 5 g |

The composition of the inkjet ink (E1) was as follows.

| Amic acid compound (B2) solution | 6.0 g |
|---|---|
| Solvent (C) | |
| GBL | 2.7 g |
| EDM | 11.3 g |

Comparative Example 2

Inkjet Ink (E2)

The polyamic acid (A-1) solution from Synthesis Example 1 was diluted according to the composition below to a viscosity of 20 mPa·s or below, to prepare an inkjet ink (E2). The viscosity of the ink was 10.8 mPa·s, and the concentration of the ink was 4.0 wt %.

| Polyamic acid (A-1) solution | 5 g |
|---|---|
| EDM | 10 g |

The composition of the inkjet ink (E2) was as follows.

| Polyamic acid (A-1) | 0.60 g |
|---|---|
| Solvent (C) | |
| GBL | 4.4 g |
| EDM | 10.0 g |

TABLE 2

| Inkjet Ink | Polyamic Acid (A) | Amic Acid Compound (B1 or B2) | Solvent (C) | Viscosity (mPa·s) |
|---|---|---|---|---|
| Example 1 | (1) | (A-1) 0.48 g | (B2) 2.40 g | GBL (3.52 g) EDM (5.60 g) | 13.3 |

TABLE 2-continued

| | Inkjet Ink | Polyamic Acid (A) | Amic Acid Compound (B1 or B2) | Solvent (C) | Viscosity (mPa·s) |
|---|---|---|---|---|---|
| Example 2 | (2) | (A-2) 0.36 g | (B2) 2.40 g | GBL (3.72 g) EDM (5.52 g) | 14.0 |
| Example 3 | (3) | (A-3) 0.20 g | (B2) 2.00 g | NMP (0.90 g) GBL (0.90 g) EDM (6.00 g) | 10.8 |
| Comparative example 1 | (E1) | — | (B2) 6.00 g | GBL (2.70 g) EDM (11.3 g) | 14.4 |
| Comparative example 2 | (E2) | (A-1) 0.6 g | — | GBL (4.4 g) EDM (10.0 g) | 10.8 |

Example 4

Formation of Polyimide Film Using Inkjet Ink (1) and Flexibility Evaluation (1) Formation of Linearized Polyimide Film by Ink jet Printing The inkjet ink (1) prepared in Example 1 was applied on a glass epoxy resin substrate with copper on both sides of 1.5 mm thick as an inkjet ink to perform linear coating by an ink jet coating apparatus DMP-2831 manufactured by FUJIFILM Dimatix Company, in which the dot pitch was set to be 40 μm and 20 μm by single dot width. The heater of the inkjet head was set at 30° C., the piezo voltage was set at 16 V, and the driving frequency was set at 5 kHz. The substrate was dried for 5 min on a hot plate of 80° C., and then heated for 30 min in an oven of 230° C., to prepare a linearized polyimide insulation film.

The line width of the resulting polyimide film and uniformity thereof were observed under an optical microscope, and then the film thickness was measured. The film thickness was calculated by averaging the measured values at 3 spots by using a stylus film thickness gauge α-STEP 200 manufactured by KLA-Tencor Japan Co. Ltd. A uniform film was prepared, whose thickness and line width were respectively 1.25 μm and 120 μm.

(2) Flexibility of Polyimide Film (Bending Endurance)

The inkjet ink (1) synthesized in Example 1 was applied onto a substrate (Kapton 200H (50 μm thick), manufactured by DUPONT-TORAY Co. Ltd.) by using an applicator. Then, the substrate was dried at 50° C. for 30 min by a hot plate, and further heated for 30 min in an oven of 230° C. to form a film on one side of the substrate. Afterwards, the film was cut into a test sample of 1.5 cm wide and 13 cm long in such a manner that the transverse direction (TD) of the substrate became the longitudinal direction of the test sample.

The test sample was bended at a rate of 175 times per minute by using a bending endurance tester (MIT-DA, manufactured by Toyo Seiki Co. Ltd.), in which the curvature radius of the curved side was set at 0.38 mm, the curved angle was set at 135°, and the tension was set at 4.9 N, to observe whether cracks were generated or not at particular bending times. As a result, no cracks was generated at 1000 bending times, and the film was evaluated as ⊚.

The results of flexibility were evaluated as follows.

⊚: no cracks generated at 1000 bending times

○: No cracks generated at 500 bending times, but cracks generated at 1000 bending times Δ: No cracks generated at 100 bending times, but cracks generated at 500 times of bend The flexibility of the inkjet ink superior to ○ was determined as good.

Examples 5-6

Formation of Polyimide Film Using Inkjet Inks (2)-(3) and Flexibility Evaluation A linearized insulation polyimide film was prepared by using the same conditions as those in Example 4, except that the inkjet ink shown in table 2 was used. Furthermore, a bending endurance test sample was fabricated under the same conditions as those in Example 4, and bended to observe whether cracks were generated or not at particular bending times. The results were shown in Table3.

Comparative Examples 3

Formation of Polyimide Film Using Inkjet Ink (E1) and Flexibility Evaluation (1) Formation of Linearized Polyimide Film by Ink jet Printing A linearized insulation polyimide film was prepared under the same conditions as those in Example 4, except that the inkjet ink (E1) synthesized in Comparative Example 1 was used as the inkjet ink.

The resulting polyimide film was evaluated under the same conditions as those in Example 4. The result was that the line width of the polyimide film was 230 μm, which is wider than that in coating. The linearized film thickness of the polyimide film was 1.43 μm, and a uniform film was prepared.

(2) Flexibility of Polyimide Film (Bending Endurance)

A bending endurance test sample was fabricated under the same conditions as those in Example 4, except that the inkjet ink (E1) synthesized in Comparative Example 1 was used.

The test sample was bended under the same conditions as those in Example 4, to observe whether cracks were generated or not at particular bending times. As a result, no cracks was generated at 100 bending times, but cracks were generated at 500 bending times, and the film was evaluated as Δ.

Comparative Example 4

Formation of Polyimide Film Using Inkjet Ink (E2) and Flexibility Evaluation (1) Formation of Linearized Polyimide Film by Ink jet Printing The linearized insulation polyimide film was formed under the same conditions as those in Example 4, except that the inkjet ink (E2) synthesized in Comparative Example 2 was used. The result was that, as the inkjet ink had a component of high molecular weight as the primary component, and the elongation of the high molecular chain led to the presence of drawing character, the formation process of the ink droplet was greatly affected, and a uniform polyimide film cannot be formed.

(2) Flexibility of Polyimide Film (Bending Endurance)

A bending endurance test sample was fabricated under the same conditions as those in Example 4, except that the inkjet ink (E2) synthesized in Comparative Example 2 was used.

The test sample was bended under the same conditions as those in Example 4, to observe whether cracks were generated at particular bending times. As a result, no cracks was generated at 1000 times of bending yet, and the film was evaluated as ⊚.

TABLE 3

| Example | Inkjet Ink | Weight-average Molecular Weight of Polyamic acid (A) | Amic Acid Compound (B2) | Viscosity (mPa·s) | Line Width (μm) | Linearized Film Thickness (μm) | Flexibility |
|---|---|---|---|---|---|---|---|
| Example 4 | (1) | 117,000 | Yes | 13.3 | 120 | 1.25 | ⊚ |
| Example 5 | (2) | 207,000 | Yes | 14.0 | 135 | 1.15 | ○ |
| Example 6 | (3) | 122,000 | Yes | 10.8 | 150 | 1.05 | ○ |
| Comparative Example 3 | (E1) | — | Yes | 14.4 | 230 | 1.43 | Δ |
| Comparative Example 4 | (E2) | 117,000 | No | 10.8 | —[1] | —[1] | ⊚ |

[1] Determination cannot be performed, as a uniform polyimide film cannot be formed by ink jet coating.

INDUSTRIAL APPLICABILITY

The effective usages of the present invention include, for example: insulation film for flexible wiring board, and electronic components using the insulation film for flexible wiring board.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An inkjet ink, comprising:
a polyamic acid (A) having a weight-average molecular weight of 50,000-500,000 and a structural unit of Formula (1) below prepared from at least a compound (a1) having two or more anhydride groups and a diamine (a2);
at least one selected from the group consisting of an amic acid compound (B1) prepared from a compound (a3) having two or more anhydride groups and a monoamine (a5), and an amic acid compound (B2) prepared from a diamine (a4) and a compound (a6) having one anhydride group; and
a solvent (C),

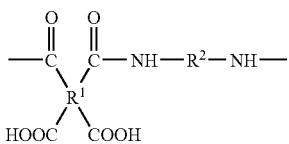
(1)

wherein in Formula (1), $R^1$ and $R^2$ are each independently an organic group having 2-100 carbon atoms, wherein the inkjet ink comprises 0.5 wt %-4 wt % of the polyamic acid (A), 15 wt %-50 wt % of the amic acid compound (B1) and the amic acid compound (B2) in total, and 46 wt %-84.5 wt % of the solvent (C).

2. The inkjet ink according to claim 1, wherein the compounds (a1) and (a3) having two or more anhydride groups are each independently one or more selected from the group consisting of tetracarboxylic dianhydride of Formula (2) below, and a copolymer formed by a monomer having anhydride group and other polymerizable monomer,

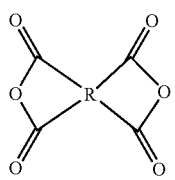
(2)

wherein in Formula (2), each R is independently an organic group having 2-100 carbon atoms.

3. The inkjet ink according to claim 1, wherein the diamines (a2) and (a4) are each independently a diamine of general Formula (3) below;

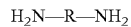
(3)

wherein in Formula (3), each R is independently an organic group having 2-100 carbon atoms.

4. The inkjet ink according to claim 1, wherein the monoamine (a5) is an amino silicon compound of general Formula (4) below,

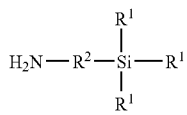
(4)

wherein in Formula (4), each $R^1$ is independently hydrogen, halogen, or an organic group having 1-20 carbon atoms, and each $R^2$ is independently an organic group having 1-20 carbon atoms.

5. The inkjet ink according to claim 1, wherein the compound (a6) having one anhydride group is a silicon containing carboxylic anhydride of general Formula (5) below,

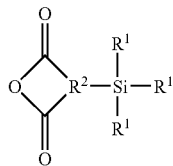

(5)

wherein in Formula (5), each $R^1$ is independently hydrogen, halogen, or an organic group having 1-20 carbon atoms, and $R^2$ is an organic group having 1-20 carbon atoms.

6. The inkjet ink according to claim 2, wherein the tetracarboxylic dianhydride of Formula (2) is one or more selected from the group consisting of pyromellitic dianhydride, 3,3',4,4'-benzophenonetetracarboxylic dianhydride, 2,2'3,3'-benzophenonetetracarboxylic dianhydride, 2,3,3',4'-benzophenonetetracarboxylic dianhydride, 3,3',4,4'-diphenylsulfonetetracarboxylic dianhydride, 2,2',3,3'-diphenylsulfonetetracarboxylic dianhydride, 2,3,3',4'-diphenylsulfonetetracarboxylic dianhydride, 3,3',4,4'-diphenylethertetracarboxylic dianhydride, 2,2',3,3'-diphenylethertetracarboxylic dianhydride, 2,3,3',4'-diphenylethertetracarboxylic dianhydride, 2,2-[bis(3,4-dicarboxylphenyl)]hexafluoropropane dianhydride, ethylene glycol bis(anhydrotrimellitate), cyclobutane tetracarboxylic dianhydride, methylcyclobutane tetracarboxylic dianhydride, cyclopentanetetracarboxylic dianhydride, 1,2,4,5-cyclohexane tetracarboxylic dianhydride, ethane tetracarboxylic dianhydride, and butane tetracarboxylic dianhydride.

7. The inkjet ink according to claim 3, wherein the diamine of Formula (3) is one or more selected from the group consisting of 3,3'-diaminodiphenylsulfone, 4,4'-diaminodiphenyl ether, 4,4'-diaminodiphenylmethane, 3,3'-diaminodiphenylmethane, 3,3'-dimethyl-4,4'-diamino diphenylmethane, 2,2-bis[4-(4-aminophenoxy)phenyl] propane, 2,2-bis[4-(4-aminophenoxy)phenyl] hexafluoropropane, m-phenylenediamine, p-phenylenediamine, m-xylylenediamine, p-xylylenediamine, 2,2'-diaminodiphenylpropane, benzidine, 1,1-bis[4-(4-aminophenoxy)phenyl]cyclohexane, 1,1-bis[4-(4-aminophenoxy)phenyl]-4-methyl cyclohexane, bis[4-(4-aminobenzyl)phenyl]methane, 1,1-bis[4-(4-aminobenzyl)phenyl]cyclohexane, 1,1-bis[4-(4aminobenzyl)phenyl]4-methylcyclohexane, 1,1-bis[4-(4-aminobenzyl)phenyl]cyclohexane, 1,1-bis[4-(4-aminobenzyl)phenyl]-4-methylcyclohexane, 1,1-bis[4-(4-aminobenzyl)phenyl]methane, 1,3-bis(4-aminophenoxy)benzene, and a compound of Formula (XV) below,

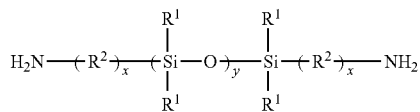

(XV)

wherein in Formula (XV), each $R^1$ is independently an alkyl group having 1-3 carbon atoms or phenyl, each $R^2$ is independently methylene, phenylene, or phenylene substituted with alkyl, each x is independently an integer of 1-6, and each y is independently an integer of 1-70.

8. The inkjet ink according to claim 4, wherein the amino silicon compound of Formula (4) above is one or more selected from the group consisting of p-aminophenyltrimethoxysilane, p-aminophenyltriethoxysilane, m-aminophenyltrimethoxysilane, m-aminophenyltriethoxysilane, 3-aminopropyltrimethoxysilane, and 3-aminopropyltriethoxysilane.

9. The inkjet ink according to claim 5, wherein the silicon containing carboxylic anhydride of Formula (5) above is one or more selected from the group consisting of p-(trimethoxysilyl)phenylsuccinic anhydride, p-(triethoxysilyl)phenylsuccinic anhydride, m-(trimethoxysilyl)phenylsuccinic anhydride, m-(triethoxysilyl)phenylsuccinic anhydride, trimethoxysilylpropylsuccinic anhydride, and triethoxysilylpropylsuccinic anhydride.

10. An inkjet ink, comprising:
a polyamic acid (A) having a weight-average molecular weight of 50,000-500,000, prepared from a compound (a1) having two or more anhydride groups and a diamine (a2), wherein the compound (a1) having two or more anhydride groups is at least one selected from the group consisting of 3,3',4,4'-diphenylether tetracarboxylic dianhydride and 2,2-[bis(3,4-dicarboxylphenyl)] hexafluoropropane dianhydride, and the diamine (a2) is at least one selected from the group consisting of 2,2-bis[4-(4-aminophenoxy)phenyl]propane and 1,3-bis(4-aminophenoxy)benzene;
an amic acid compound (B2) prepared from a diamine (a4) and a compound (a6) having one anhydride group, wherein the diamine (a4) is 2,2-bis[4-(4-aminophenoxy)phenyl]propane, and the compound (a6) having one anhydride group is triethoxysilylpropylsuccinic anhydride; and
a solvent (C) being at least one selected from the group consisting of diethylene glycol methyl ethyl ether, N-methyl-2-pyrrolidone, and γ-butyrolatone, wherein the inkjet ink comprises 0.5 wt %-4 wt % of the polyamic acid (A), 15 wt %-50 wt % of the amic acid compound (B1) and the amic acid compound (B2) in total, and 46 wt %-84.5 wt % of the solvent (C).

11. A polyimide film or a patterned polyimide film, prepared from the inkjet ink according to any one of claims 1 to 10.

12. A polyimide film or patterned polyimide film, prepared by forming a polyamic acid film by applying the inkjet ink according to any one of claims 1 to 10 through an ink jetting process, and forming a polyimide film by processing the polyamic acid film.

13. A film substrate, prepared by forming a polyimide film according to claim 11 on a substrate.

14. An electronic component, having a film substrate according to claim 13.

* * * * *